US007669005B1

(12) United States Patent
Park et al.

(10) Patent No.: US 7,669,005 B1
(45) Date of Patent: Feb. 23, 2010

(54) CONTENT ADDRESSABLE MEMORY (CAM) DEVICES HAVING SOFT PRIORITY RESOLUTION CIRCUITS THEREIN AND METHODS OF OPERATING SAME

(75) Inventors: Kee Park, San Jose, CA (US); Robert J. Proebsting, Senora, CA (US); Scott Yu-Fan Chu, Cupertino, CA (US); Michael Miller, Saratoga, CA (US); Mark Baumann, Campbell, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 1241 days.

(21) Appl. No.: 10/613,542

(22) Filed: Jul. 3, 2003

Related U.S. Application Data

(63) Continuation-in-part of application No. 09/884,797, filed on Jun. 18, 2001, now Pat. No. 6,996,662.

(60) Provisional application No. 60/397,639, filed on Jul. 22, 2002.

(51) Int. Cl.
*G06F 12/00* (2006.01)
(52) U.S. Cl. ...................................... 711/108
(58) Field of Classification Search .................. 711/108
See application file for complete search history.

(56) References Cited

U.S. PATENT DOCUMENTS

| 5,467,319 | A | 11/1995 | Nusinov et al. |
| 5,555,397 | A | 9/1996 | Sasama et al. |
| 5,930,359 | A | 7/1999 | Kempke ...................... 713/160 |
| 6,249,467 | B1 | 6/2001 | Pereira et al. |

(Continued)

OTHER PUBLICATIONS

Kobayashi et al. "A longest prefix match search engine for multi-gigabit IPprocessing" *IEEE International Conference on Communications* 3:1360-1364 (2000).

*Primary Examiner*—Matt Kim
*Assistant Examiner*—Ryan Dare
(74) *Attorney, Agent, or Firm*—Mahamedi Paradice Kreisman LLP; William L. Paradice, III

(57) ABSTRACT

Content addressable memory (CAM) devices use both hard and soft priority techniques to allocate entries of different priority therein. The priorities of multiple CAM array blocks within the CAM device may be programmed before or as entries are loaded therein and may be reprogrammed during operation as the allocation of entries within the CAM device changes. The allocation of entries may change in response to additions or deletions of entries or as entries are reprioritized. The CAM devices include preferred priority resolution circuits that can resolve competing soft and hard priorities between multiple hit signals that are generated in response to a search operation. Such hit signals may be active to reflect the presence of at least one matching entry within a CAM array block. The resolution of which active hit signal has the highest overall priority among many can be used to facilitate the identification of the location (e.g., array address and row address) of a highest priority matching entry within the entire CAM device. A priority resolution circuit may also resolve competing hard priorities between two or more active hit signals having equivalent soft priority. This aspect of the priority resolution circuit is provided so that an active hit signal having a highest overall priority can be resolved whenever multiple CAM array blocks having the same soft priority are detected as having matching entries therein during a search operation.

23 Claims, 14 Drawing Sheets

U.S. PATENT DOCUMENTS

| | | |
|---|---|---|
| 6,339,539 B1 | 1/2002 | Gibson et al. |
| 6,374,326 B1 | 4/2002 | Kansal et al. |
| 6,493,793 B1 | 12/2002 | Pereira .................. 711/108 |
| 6,499,081 B1 | 12/2002 | Nataraj .................. 711/108 |
| 6,542,391 B2 * | 4/2003 | Pereira et al. ............ 365/49.15 |
| 6,567,340 B1 | 5/2003 | Nataraj et al. |
| 6,687,785 B1 | 2/2004 | Pereira .................. 711/108 |
| 6,693,814 B2 | 2/2004 | McKenzie et al. |
| 6,697,276 B1 | 2/2004 | Pereira .................. 365/49 |
| 6,697,912 B2 | 2/2004 | Akkary .................. 711/108 |
| 6,748,484 B1 | 6/2004 | Henderson .................. 711/108 |
| 6,763,426 B1 | 7/2004 | James .................. 711/108 |
| 6,910,097 B1 | 6/2005 | Srinivasan et al. |
| 6,934,795 B2 | 8/2005 | Nataraj et al. |
| 6,937,491 B2 | 8/2005 | Park et al. |
| 6,954,823 B1 * | 10/2005 | James et al. .................. 711/108 |
| 6,996,662 B2 | 2/2006 | Miller et al. |
| 7,054,993 B1 | 5/2006 | Srinivasan et al. |
| 7,069,378 B2 | 6/2006 | Park et al. |
| 7,143,231 B1 | 11/2006 | Srinivasan et al. |
| 7,185,141 B1 * | 2/2007 | James et al. .................. 711/108 |
| 2002/0161969 A1 | 10/2002 | Nataraj .................. 711/108 |
| 2003/0005146 A1 | 1/2003 | Miller .................. 709/238 |

* cited by examiner

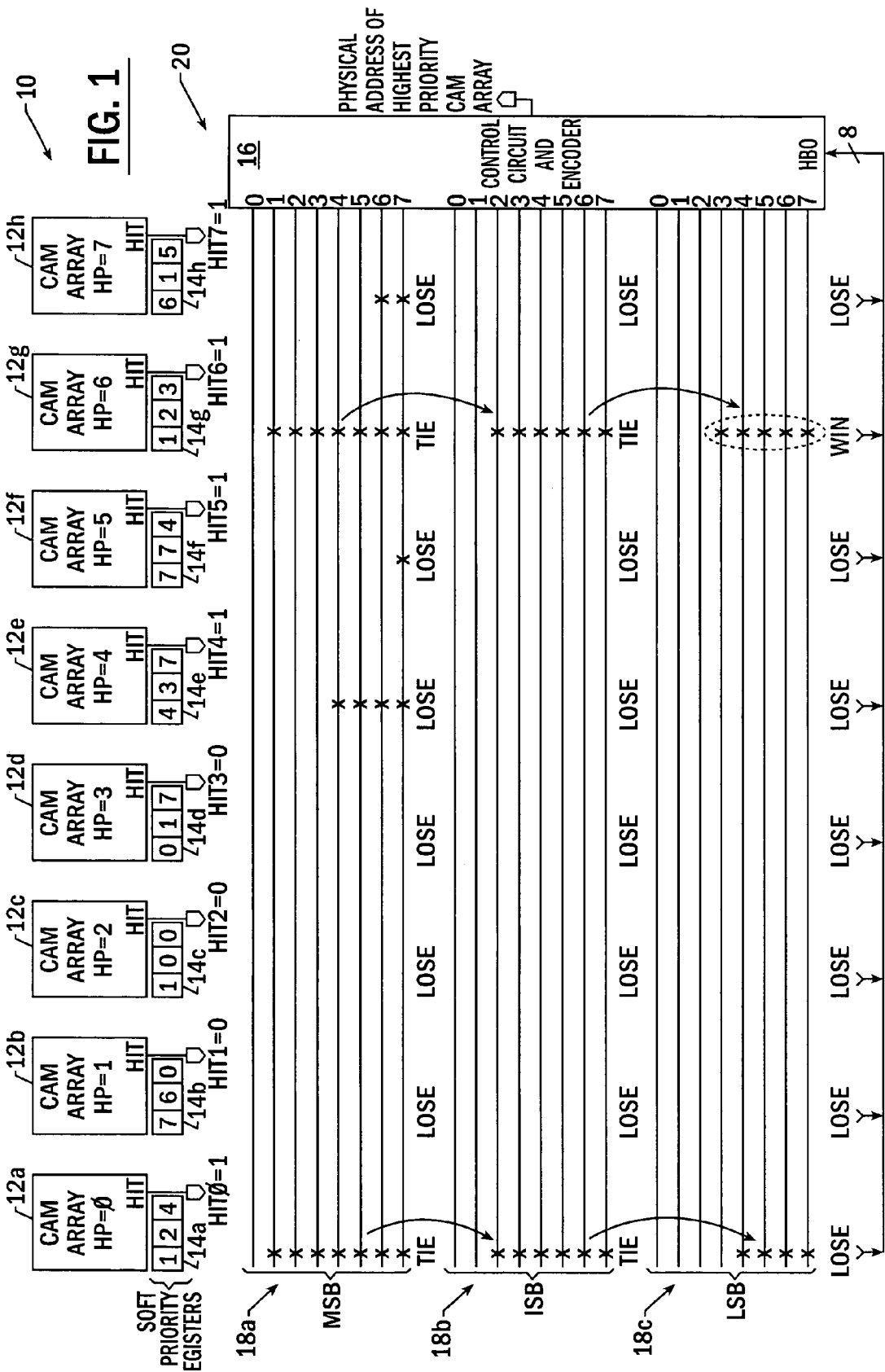

CONTENT ADDRESSABLE MEMORY (CAM) DEVICES HAVING SOFT PRIORITY RESOLUTION CIRCUITS THEREIN AND METHODS OF OPERATING SAME

REFERENCE TO PRIORITY APPLICATIONS

This application, which claims priority to U.S. Provisional Application Ser. No. 60/397,639, filed Jul. 22, 2002, is a continuation-in-part (CIP) of U.S. application Ser. No. 09/884,797, filed Jun. 18, 2001, the disclosures of which are hereby incorporated herein by reference.

CROSS-REFERENCE TO RELATED APPLICATIONS

This application is related to commonly assigned U.S. application Ser. Nos. 10/263,223 and 10/263,258 filed Oct. 2, 2002.

FIELD OF THE INVENTION

The present invention relates to integrated circuit memory devices and, more particularly, to content addressable memory (CAM) devices and methods of operating same.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data within a CAM array is not accessed by initially supplying an address, but rather by initially applying data (e.g., search words) to the array and then performing a search operation to identify one or more entries within the CAM array that contain data equivalent to the applied data and thereby represent a "match" condition. In this manner, data is accessed according to its content rather than its address. Upon completion of the search operation, the identified location(s) containing the equivalent data is typically encoded to provide an address (e.g., block address+row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM array to identify a highest priority matching entry. An exemplary CAM device that utilizes a priority encoder to identify a highest priority matching entry is disclosed in commonly assigned U.S. Pat. No. 6,370,613 to Diede et al., entitled "Content Addressable Memory with Longest Match Detect," the disclosure of which is hereby incorporated herein by reference. Additional CAM devices are described in U.S. Pat. Nos. 5,706,224, 5,852,569 and 5,964,857 to Srinivasan et al. and in U.S. Pat. Nos. 6,101,116, 6,256,216 and 6,128,207 to Lien et al., assigned to the present assignee, the disclosures of which are hereby incorporated herein by reference.

High capacity CAM devices may also include large numbers of CAM arrays therein, with one or more CAM arrays being treated as a CAM array block. Each CAM array block may be loaded with entries of a particular priority class or the entries within a particular CAM array block may be arranged in groups (e.g., sectors) having different priority classes. The CAM array blocks may also be treated as having respective "hard" priorities that are based on the physical location of a respective block within the CAM device. In this manner, entries associated with a particular priority class may be loaded into a CAM array block(s) having a corresponding hard priority associated therewith. Unfortunately, this conventional allocation of entries of different priority classes within a CAM device may use inefficient and time consuming reloading operations in the event previously loaded entries need to be reallocated among the CAM array blocks. Such reallocation operations may be necessary as new entries are added to the CAM device or as the priorities of one or more classes of entries change over time.

Thus, notwithstanding the use of hard priority techniques to allocate entries of different priority classes within high capacity CAM devices, there continues to be a need for improved priority techniques that can allocate entries more efficiently.

SUMMARY OF THE INVENTION

CAM devices according to some embodiments of the present invention use both hard and soft priority techniques to allocate entries of different priority therein. According to some aspects of these embodiments, the priorities of multiple CAM array blocks within the CAM device may be programmed before or as entries are loaded therein and may be reprogrammed during operation as the allocation of entries within the CAM device changes. The allocation of entries may change in response to additions or deletions of entries or as entries are reprioritized, for example. According to other aspects of these embodiments, multiple CAM array blocks may be programmed with equivalent soft priorities during operation and in other embodiments all CAM array blocks may be initially programmed with equivalent soft priorities upon start-up. Each of these soft priorities may be retained by a programmable soft priority register that is associated with each CAM array block.

CAM devices according to other embodiments of the present invention include priority resolution circuits therein that can resolve competing soft and hard priorities between multiple hit signals that are generated in response to a search operation. Such hit signals may be generated as active signals to reflect the presence of at least one matching entry within a CAM array block. Each hit signal may be generated by a respective CAM array block and/or circuitry associated with a respective CAM array block. The resolution of which active hit signal has the highest overall priority among many can be used to facilitate the identification of the location (e.g., block address and row address) of a highest priority matching entry within the entire CAM device. A priority resolution circuit may also resolve competing hard priorities between two or more active hit signals having equivalent soft priority. This aspect of the priority resolution circuit is provided in some embodiments so that an active hit signal having a highest overall priority can be resolved whenever multiple CAM array blocks having the same soft priority are detected as having matching entries therein during a search operation.

According to further embodiments, the priority resolution circuit is a hierarchical priority resolution circuit having at least a MSB soft priority resolution stage and a LSB soft priority resolution stage. These stages may be used to fully resolve competing soft priorities and identify an active hit signal (or possibly multiple active hit signals) having the highest soft priority. The operations performed by the stages may resolve competing soft priorities in descending order (e.g., MSB to LSB) according to numeric significance. To resolve competing hard priorities between multiple active hit signals having highest soft priorities that are equal, a hard priority resolution stage may also be provided. In some embodiments, this hard priority resolution stage is coupled to outputs of the final soft priority resolution stage (e.g., LSB stage).

According to still further embodiments of the present invention, the CAM device includes $2^{N+1}$ CAM array blocks therein, where N is an integer (e.g., N=8), and the priority resolution circuit comprises $\log_2 N$ groups of precharged signal lines that are used during a priority resolution operation to resolve competing soft priorities between hit signals generated by the plurality of CAM array blocks. In particular, the priority resolution circuit may include $\log_2 N$ groups of N (or N−1) precharged signal lines, with each group of precharged signal lines being associated with a respective soft priority resolution stage. In these embodiments, the hierarchical priority resolution circuit may process at least first and second active hit signals using wired-OR logic to identify a highest priority one of the first and second active hit signals and selectively block another one of the first and second active hit signals from being further processed as a highest priority hit signal candidate. This wired-OR logic may be coupled to the precharged signal lines.

Still further embodiments of the present invention include methods of operating content addressable memory (CAM) devices by applying a comparand to a plurality of CAM array blocks during a search operation to thereby detect a plurality of matching entries in the plurality of CAM array blocks. The search operation may also include generating a plurality of active hit signals having respective soft and hard priorities associated therewith that correspond to soft and hard priorities of respective ones of the plurality of CAM array blocks. The competing soft priorities between the plurality of active hit signals are then resolved before resolving competing hard priorities between at least two of the active hit signals having equal soft priorities. Other embodiments of the present invention are also provided, as described more fully hereinbelow.

BRIEF DESCRIPTION OF THE DRAWINGS

FIG. 6 is a block diagram of a hierarchical priority resolution circuit according to an embodiment of the present invention.

DESCRIPTION OF PREFERRED EMBODIMENTS

Figure 2:
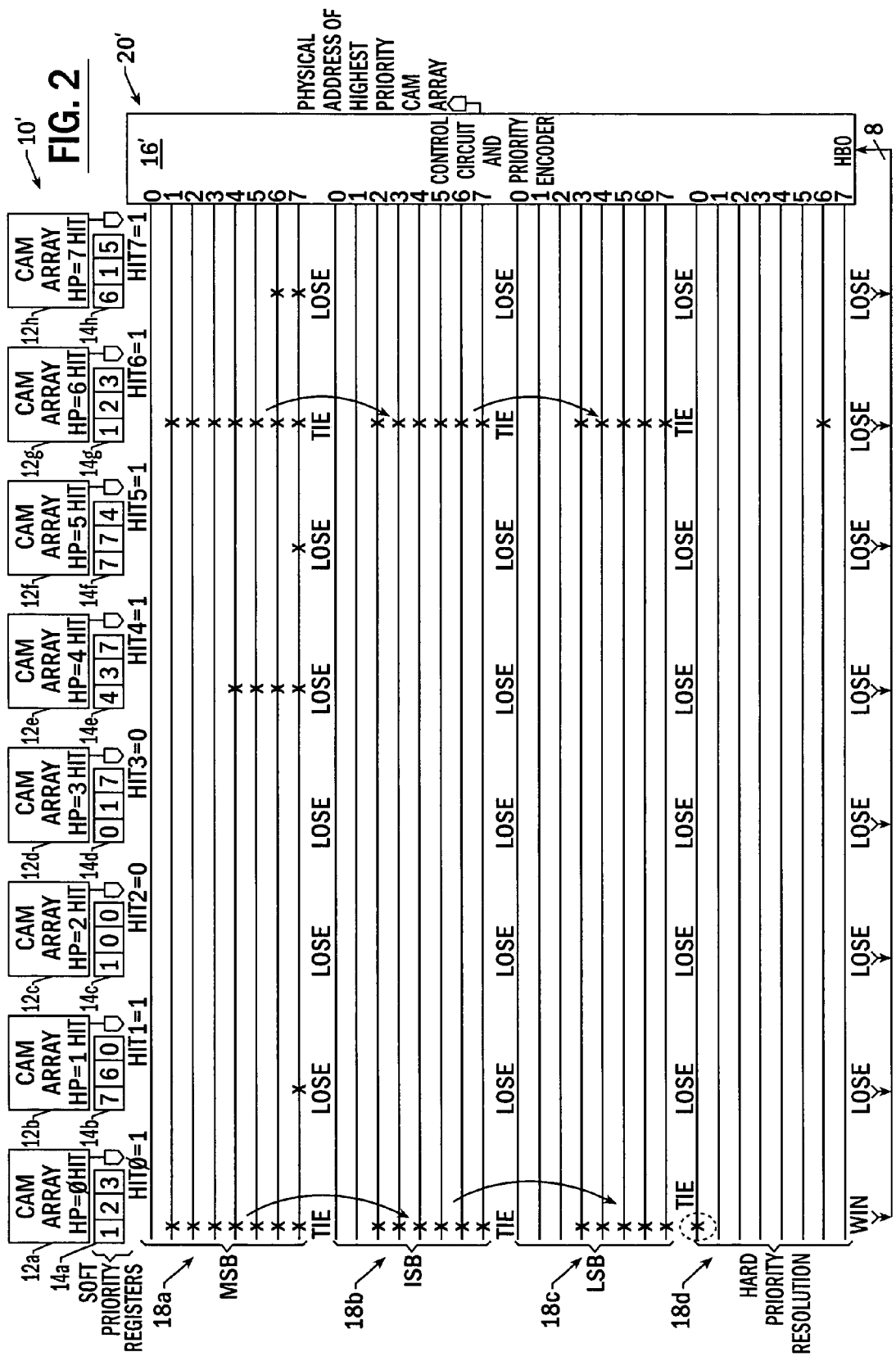
FIG. 2 is a block diagram of a CAM device according to an embodiment of the present invention.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals.

Figures 1, 6A:
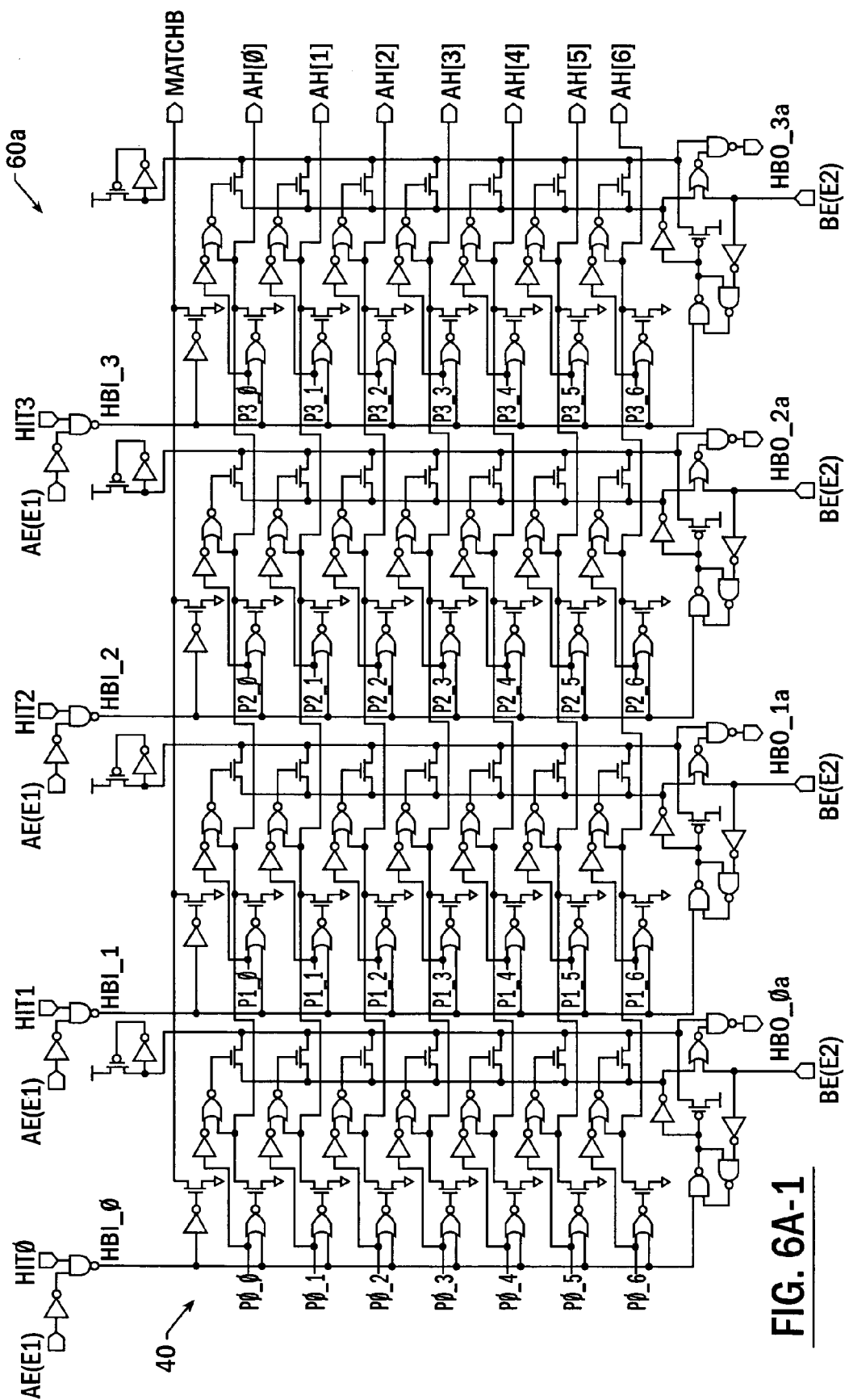
FIG. 1 is a block diagram of a CAM device according to an embodiment of the present invention.
FIG. 6A is an electrical schematic that illustrates a first soft priority resolution stage of the hierarchical priority resolution circuit of FIG. 6 according to embodiments of the present invention.
Figures 2, 6A:
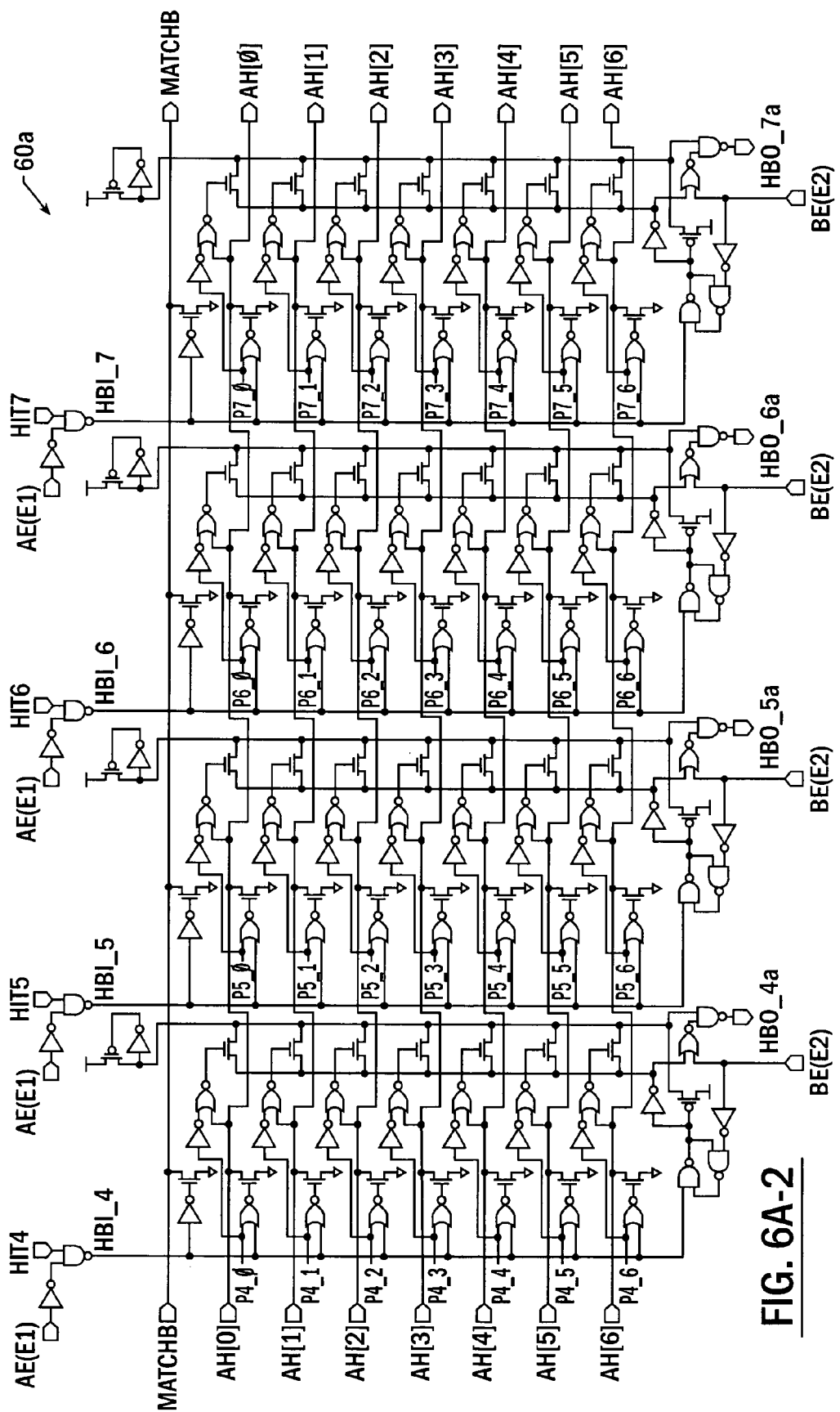
Figures 1, 6B:
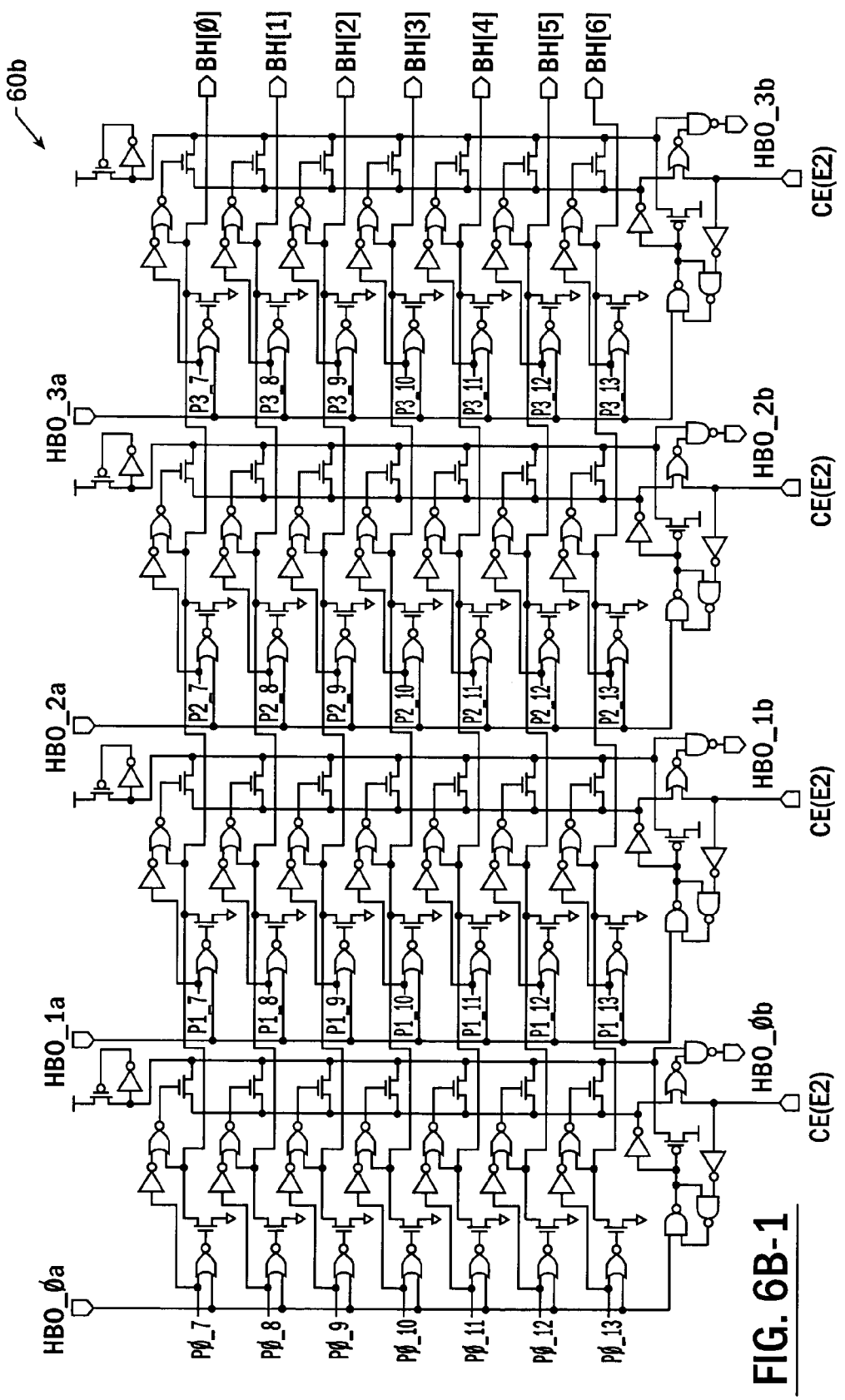
FIG. 6B is an electrical schematic that illustrates a second soft priority resolution stage of the hierarchical priority resolution circuit of FIG. 6 according to embodiments of the present invention.
Figures 2, 6B:
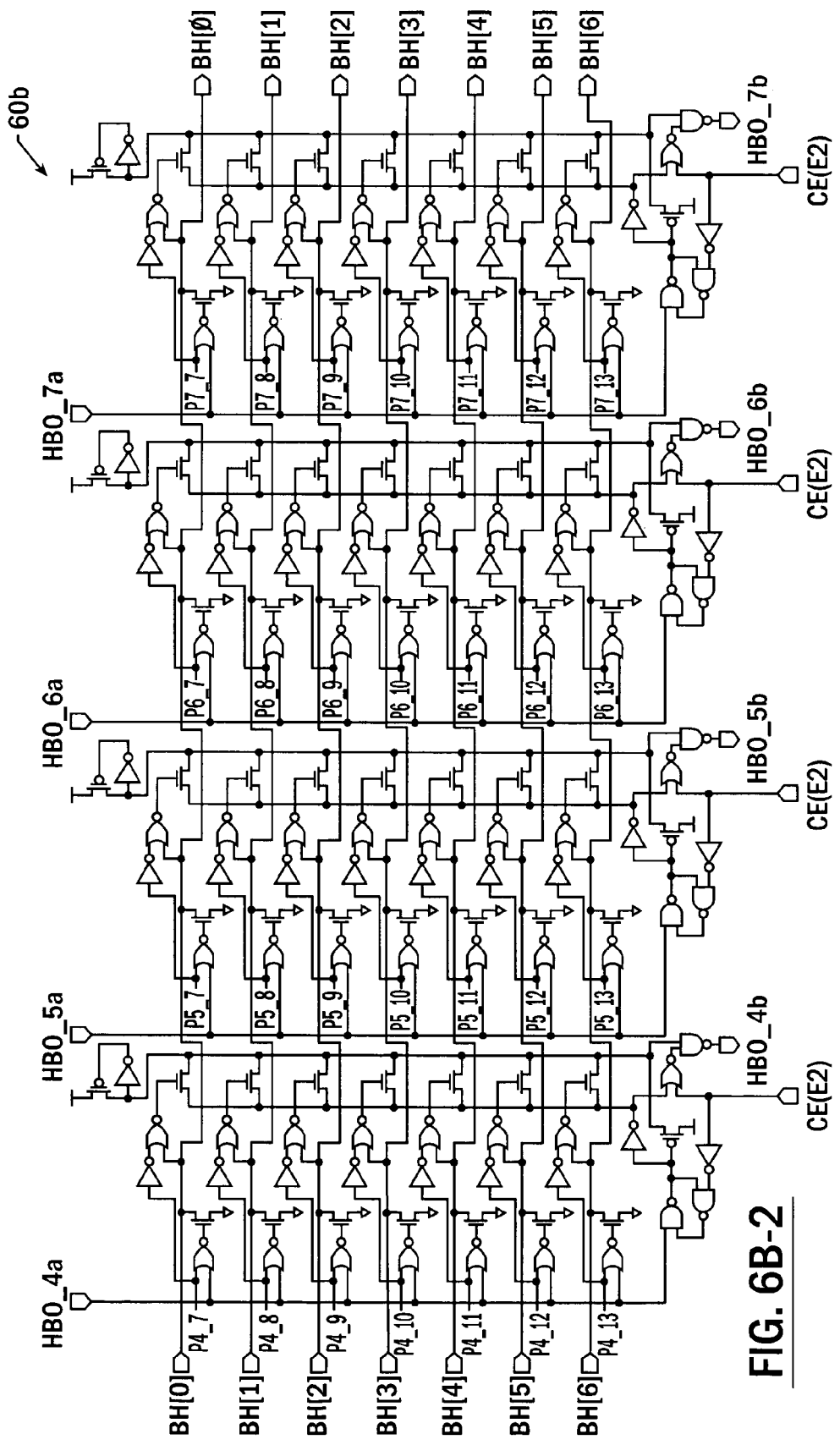
Figures 1, 6C:
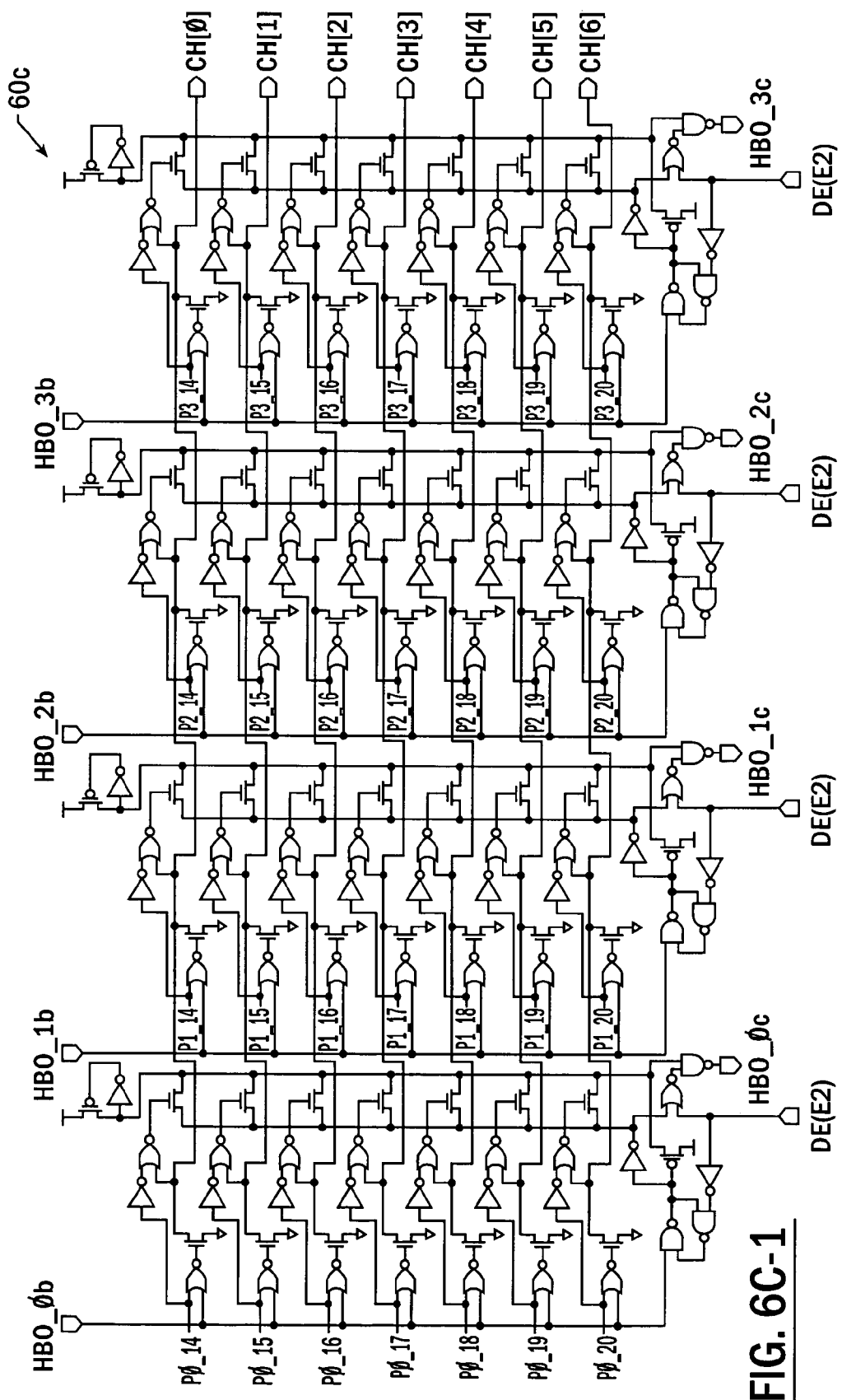
FIG. 6C is an electrical schematic that illustrates a third soft priority resolution stage of the hierarchical priority resolution circuit of FIG. 6 according to embodiments of the present invention.
Figures 2, 6C:
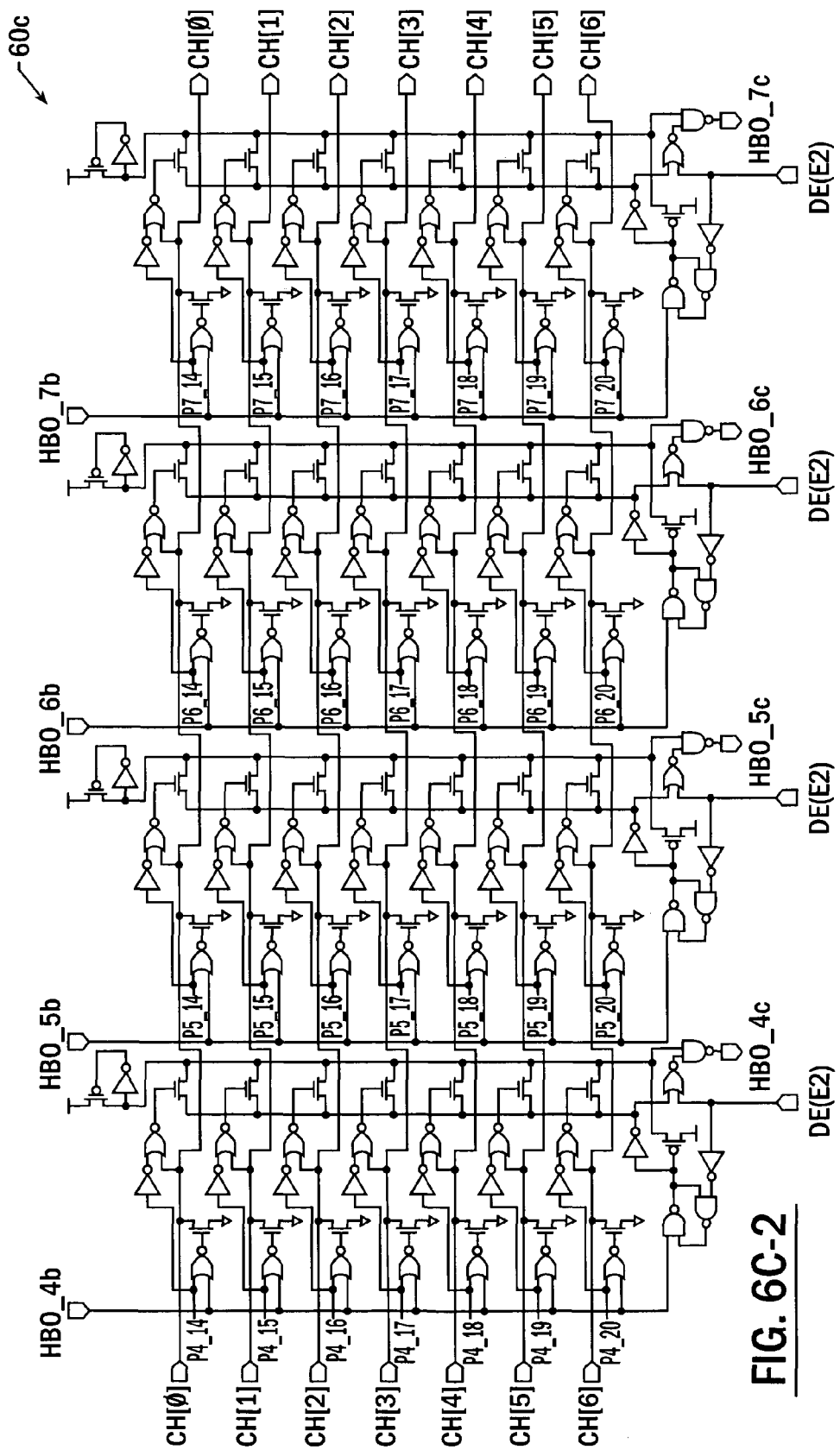

Referring now to FIG. 1, a block diagram of a content addressable memory (CAM) device 10 according to some embodiments of the present invention will be described. As illustrated by FIG. 1, the CAM device 10 includes a segment of CAM array blocks 12a-12h that are arranged according to physical/positional priority. In particular, the leftmost CAM array block 12a is illustrated as the block having the highest physical/positional priority of "0" and the rightmost CAM array block 12h is illustrated as the block having the lowest physical/positional priority of "7". These physical/positional priorities are treated herein as "hard" priorities (HP) that have been assigned to respective CAM array blocks 12a-12h according to their physical location on an integrated circuit chip containing the CAM device 10. The designation of "0" as the highest priority and "7" as the lowest priority is arbitrary. The illustrated arrangement of hard priorities may also be arbitrary or may depend on the wiring and positional requirements of a particular design or layout. Accordingly, the illustrated left-to-right sequence of decreasing hard priority is provided solely as one possible example for ease of understanding. The hard priority value associated with a CAM array block may also correspond to its physical address. This physical address of the CAM array block may be combined with a row address of a matching entry within the CAM array block to provide a complete address of the matching entry.

Each of the CAM array blocks 12a-12h is described herein as having a logical width of 72 columns (with possibly one or more redundant columns) and a logical depth of 512 rows (with possibly one or more redundant rows). Thus, the illustrated segment of the CAM device 10 has a capacity of 8×512 entries, with each entry having a width of 72 bits. The performance of a search operation between an applied ×72 search word (i.e., comparand) and the entries in the CAM array blocks 12a-12h may result in the detection of one or more matching entries therein, with the detection of at least one matching entry within a respective CAM array block being identified with an active high "HIT" signal (i.e., HITn=1, where n is an integer that designates a hard priority). As will be understood by those skilled in the art, each matching entry within a CAM array block may be identified by a corresponding match line (MATCH) that remains precharged at the end of a search operation. Accordingly, each CAM array block may include wired-OR circuitry and/or other circuitry that receives the match lines as inputs (e.g., MATCH0-MATCH511) and generates an active hit signal (HIT=1) at an output thereof whenever one or more of the match lines remain high at the end of a search operation. An active hit signal may also be referred to herein as an asserted hit signal.

The CAM device 10 may also support longer search words, including ×144, ×288 and ×576 search words by linking entries across 2, 4 or 8 CAM array blocks, for example. The illustrated portion of the CAM device 10 may represent one segment of a bank of CAM array blocks within a multi-bank CAM device. An exemplary CAM device may have a capacity of 18 million bits (18 Meg) that are stored within eight (8) banks of CAM array blocks, with each bank having eight (8) segments (i.e., 18 Meg bits=(72 bits/entry)(512 entries/block)×(8 blocks/segment)×(8 segments/bank)×(8 banks)= 512 CAM array blocks with 512 entries/block). In alternative embodiments, each CAM array block may have more than one CAM array therein. For example, a CAM array block may comprise a pair (or quad grouping) of CAM arrays that are arranged side-by-side relative to each other. Other arrangements and capacities may also be provided. The CAM device 10 may also be incorporated as a sub-circuit into an integrated circuit chip having additional functionality. For example, the CAM device 10 may be incorporated within a router look-up table that receives Classless Inter-Domain Routing (CIDR) addresses and passes these addresses as applied search words (i.e., comparands) to the CAM device 10. These CIDR addresses may have variable prefix lengths, with the length of a prefix establishing an entry's relative priority. As another example, the CAM device 10 may be incorporated within Internet protocol (IP) co-processor devices.

The CAM device 10 also includes a plurality of soft priority registers 14a-14h, which are each associated with a respective one of the CAM array blocks 12a-12h and any active hit signals (HITn) generated by these CAM array blocks 12a-12h. Thus, an active hit signal generated by a CAM array block may be treated herein as having a soft and hard priority associated therewith that matches the soft and hard priority of the corresponding CAM array block. These soft priority registers 14a-14h may be of conventional design. Each soft priority register 14a-14h is illustrated as storing a numeric soft priority value. In some embodiments, these soft priority values may be within a programmable range from 0 to 511, with each value being shown in an octal format (e.g., $511=777|_8=7(8^2)+7(8)+7$). As explained more fully hereinbelow with respect to FIG. 5, each soft priority register may be formed by 3 groups of seven (7) latches (e.g., D-type flip-flops) that are arranged in descending order by numeric significance (MSB→ISB→LSB) and are programmed to retain respective bits of soft priority data. For example, a string of twenty-one (21) logic zero values may be stored as a representation of a highest soft priority of 0 (i.e., $000|_8$) and a string of twenty-one (21) logic one values may be stored as a representation of a lowest soft priority of 511 (i.e., $777|_8$). In the event the CAM device 10 includes 512 CAM array blocks, each block may be assigned a unique soft priority value. Software programming constraints may or may not be present that preclude any two blocks from having the same soft priority.

CAM devices that use registers to provide soft priority management are also disclosed in U.S. application Ser. No. 09/884,797, entitled "Content Addressable Memory Array Having Flexible Priority Support," filed Jun. 18, 2001, assigned to the present assignee, the disclosure of which is hereby incorporated herein by reference. In particular, the '797 application discloses embodiments of CAM devices that utilize a plurality of routing values to establish the soft priorities of a respective plurality of hit signals. Each of these routing values may be selectively stored at a desired location within a programmable register and used to select the soft priority to be assigned to a respective hit signal. These routing values may, in some embodiments, constitute CAM array block addresses. These block addresses may also correspond to hard priority values associated with the CAM array blocks. The '797 application also discloses a priority encoder within encoding logic. This encoding logic may comprise a cross-point switch having a plurality of multiplexers therein that are responsive to signals generated by the programmable register. The priority encoder is configured to identify an activated hit signal having a highest soft priority from a plurality of activated hit signals having different soft priorities. Upon identification of the activated hit signal having the highest soft priority, a routing value associated with the corresponding CAM array block that generated the activated hit signal having the highest soft priority, is provided as a CAM array block address to an output of the encoding logic. The routing value is also used to select an index signal generated by the corresponding CAM array block. This index signal may constitute a row address of a highest priority matching entry within a highest priority CAM array block and may be provided along with the CAM array block address as an output index signal. This output index signal may then be used as a pointer or index into a table (e.g., SRAM-based table). This table may contain routing information that designates an output port of an output switch that receives data packets, for example.

According to some embodiments of the CAM device 10 of FIG. 1, an array priority encoder 20 is provided. The array priority encoder 20 is illustrated as including a control circuit and encoder 16 and a plurality of groups of signal lines 18a-18c. The control circuit and encoder 16 and the signal lines 18a-18c may operate as one embodiment of a hierarchical priority resolution circuit that identifies a highest priority one of the CAM array blocks 12a-12h having at least one matching entry therein, in response to a search operation. Operations performed by the hierarchical priority resolution circuit according to some embodiments of the invention are illustrated at a conceptual level by the plurality of groups of signal lines 18a-18c. As described more fully hereinbelow, in some embodiments these signal lines 18a-18c are biased (or floated) at precharged high levels at a commencement of an appropriate stage of a priority resolution operation. Each priority resolution operation may be performed in response to a search or look-up operation that performs a comparison between an applied search word (i.e., comparand) and entries in a plurality of CAM array blocks.

The plurality of CAM array blocks 12a-12h may be searched in parallel during one or more consecutive cycles of a search operation (e.g., pipelined search operation), to identify whether one or more matching entries is present within the CAM device 10. Operations to identify matching entries within CAM array blocks are well known to those skilled in the art and need not be described further herein. The identification of at least one matching entry within a CAM array block may be designated by a respective active HIT signal, shown as HIT0-HIT7. Then, during first, second and third consecutive "soft" phases of a hierarchical priority resolution operation, the array priority encoder 20 may operate to determine which of the active HIT signals is associated with a CAM array block having a highest soft priority. The number of soft phases within a hierarchical priority resolution operation may vary depending on application and need not be limited to three or more phases. For example, if the CAM device 10 includes 256 CAM array blocks, then the soft priority values may range from 0 to 255, with the lowest priority value of 255 being represented as $3333|_4$. This four-bit expression of soft priority translates to the use of four soft phases within the hierarchical priority resolution operation. Under these circumstances, four groups of precharged signal lines with four (or three) signal lines per group may be used, as explained more fully hereinbelow. Alternatively, if the CAM device 10 includes 64 CAM array blocks, then the soft priority values may range from 0 to 63, with the lowest priority value of 63 being represented as $77|_8$ in octal format. This 2-bit expression of soft priority translates to the use of two soft phases within the hierarchical priority resolution operation. Under these circumstances, two groups of precharged signal lines with eight (or seven) signal lines per group may be used.

By evaluating the numeric values of the soft priority data stored within the soft priority registers 14a-14h of FIG. 1, the seventh CAM array block 12g can be identified as the block having the highest soft priority in the illustrated example. This result is achieved because the numeric value "123" in the seventh soft priority register 14g is higher than all the other numeric values associated with soft priority registers 14a, 14e, 14f and 14h (i.e., 123 is higher in priority than 124, 437, 774 or 615).

The first soft phase of the priority resolution operation may be treated as a "competition" that includes comparing the most significant bits of the soft priority data stored within the first, fifth, sixth, seventh and eighth soft priority registers 14a, 14e, 14f, 14g and 14h, respectively, and blocking all soft priority data associated with inactive HIT signals (i.e., HITn=0). As explained more fully hereinbelow with respect to the soft priority resolution circuit of FIG. 3, the comparison of the most significant bits may be performed by discharging one or more precharged signal lines within the first group 18a. As illustrated, a most significant bit equal to "1" causes signal lines 1-7 in the first group 18a to be discharged if the corresponding CAM array block contains at least one matching entry. Likewise, a most significant bit equal to "4" may cause signal lines 4-7 in the first group 18a to be discharged if the corresponding CAM array block contains at least one matching entry. The same operations are also applied to all other most significant bits of the soft priority data in order to resolve which one(s) of the CAM array blocks having at least one matching entry therein has a soft priority with a highest most significant bit. Because the most significant bits (MSB) of the numeric values 124 and 123 stored within the first and seventh soft priority registers 14a and 14g are the highest, they both win the competition over all other most significant bits and tie each other. Detailed circuitry to perform these soft priority resolution operations according to some embodiments of the present invention is described more fully hereinbelow with respect to FIGS. 3-6.

The second soft phase of the priority resolution operation may include comparing the intermediate significant bits (ISB) of the numeric values stored within the first and seventh soft priority registers 14a and 14g and blocking all competition with "losers" from the first stage. Because the intermediate significant bits of the numeric values 124 and 123 stored within the first and seventh soft priority registers 14a and 14g are the same (i.e., both ISB values equal "2"), a tie will be present at the end of the second phase. This tie is evidenced by the fact that both the first CAM array block 12a and the seventh CAM array block 12g have soft priorities that cause signals lines 2-7 in the second group 18b to be pulled down from precharged high levels.

The priority competition then passes to the third stage where the least significant bit (LSB) of the numeric value stored within the seventh soft priority register 14g wins out over the least significant bit of the numeric value stored within the first soft priority register 14a. In other words, the least significant bit "3" in the seventh soft priority register 14g wins the competition because it is higher in priority than the least significant bit "4" in the first soft priority register 14a.

Finally, treating the priority resolution operations from a conceptual standpoint, output signals "WIN" and "LOSE" may be passed from the last phase of the competition to the control circuit and encoder 16. In response to these output signals, the control circuit and encoder 16 may then generate the physical address of the highest priority CAM array blocks having at least one matching entry therein. As will be understood by those skilled in the art, additional circuitry (not shown) may be used to resolve the highest priority row address of one or more matching entries within the identified highest priority CAM array. This additional circuitry may be of conventional design and may be provided as an additional encoding stage that is electrically coupled to an output of the illustrated control circuit and encoder 16.

Operation of the CAM device 10 of FIG. 1 may be constrained by a requirement that no two (or more) CAM array blocks may be programmed to have the same soft priority. Thus, upon start up, when a CAM device is being loaded with new entries, each CAM array block may be required to have a unique soft priority value in a range from 0 (highest) to 511 (lowest), for example. Moreover, additional "insert", "shift" and "replace" operations may be performed by the CAM device 10 in the event the priorities of entries within a particular CAM array block change and/or the priorities of multiple CAM array blocks are rearranged. These additional operations may also be performed in the event new entries of a given priority being loaded into a partially full CAM array device spill over from one full CAM array block into an unused CAM array block and the soft priority of that newly active CAM array block is reprogrammed to reflect an intermediate soft priority that is next in sequence to the soft priority of the full CAM array block. Such additional operations may be difficult to implement in a CAM device.

The CAM device 10' of FIG. 2 addresses the potential constraints associated with operating the CAM device 10 of FIG. 1 in certain applications, by including a final hard priority resolution phase to the hierarchical priority resolution operation. In particular, the CAM device 10' of FIG. 2 includes an array priority encoder 20' having a fourth group of signal lines 18d that may be used to resolve which one of two or more active hit signals having equivalent highest soft priorities has the highest hard priority. As illustrated by the numeric values stored within the first and the seventh soft priority registers 14a and 14g in FIG. 2, the hit signals generated by the first and seventh CAM array blocks 12a and 12g will be tied at the end of the third soft phase of the priority resolution operation. To resolve this tie condition in the soft priorities, a fourth phase of the priority resolution operation may be performed to identify the first CAM array block 12a as having a higher hard priority (HP=0) relative to the seventh CAM array block 12g (HP=6). In this manner, only one winner will be passed to the control circuit and encoder 16'. Circuitry that can perform this final phase of the priority resolution operation according to some embodiments of the invention is more fully illustrated by the hard priority resolution circuits of FIGS. 6D-1 and 6D-2.

Figure 3:
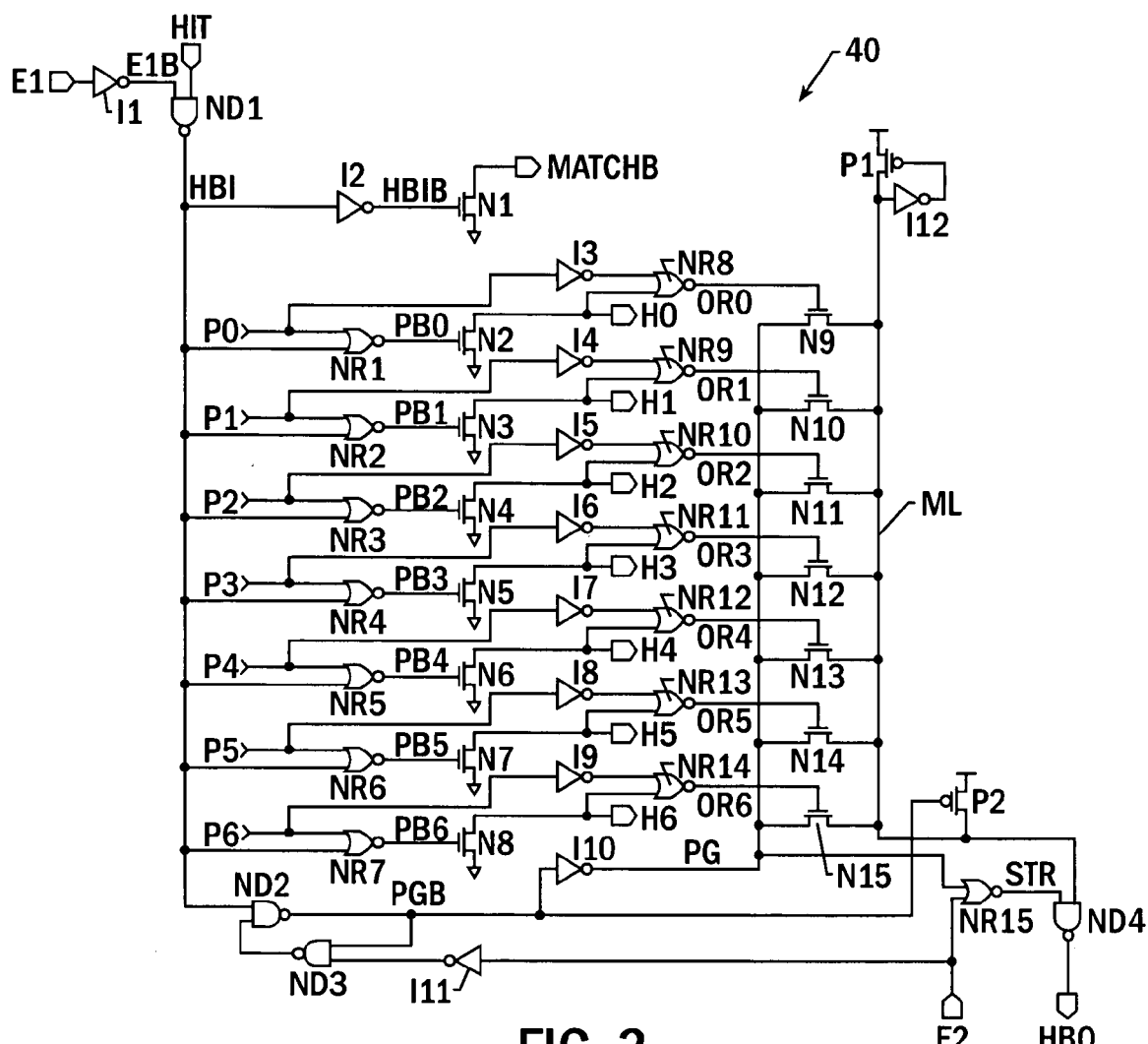
FIG. 3 is an electrical schematic of one column of one stage of a soft priority resolution circuit according to an embodiment of the present invention.

The conceptual descriptions of the hierarchical priority resolution operations provided above with respect to FIGS. 1-2 will now be described in greater detail and include specific references to circuit components for carrying out the operations in a preferred manner. For example, FIG. 3 is an electrical schematic of a soft priority resolution circuit 40 that is used as one of a plurality of soft priority resolution circuits 40. These circuits 40 may be arranged side-by-side as columns within a first stage or tier of a hierarchical priority resolution circuit. As illustrated by FIG. 6, additional soft (and/or hard) priority resolution circuits within lower stages may also be provided. The illustrated soft priority resolution circuit 40 of FIG. 3 is responsive to an active high hit signal HIT that may be generated by a CAM array block during a search operation to reflect the presence of at least one matching entry within the CAM array block.

As illustrated by FIG. 3, a first input of a first NAND gate ND1 is provided to receive the hit signal HIT and to generate an active low complementary hit signal HBI ("hit bar in") at an output thereof. The first NAND gate ND1 also includes a second input that receives a complementary first enable signal E1B ("enable one bar"). The signal E1B is generated by a first inverter I1 that is responsive to an active low first enable signal E1. Based on the illustrated connections between the first inverter I1 and the first NAND gate ND1, a high-to-low transition of the first enable signal E1 will cause the first NAND gate ND1 to switch the complementary hit signal HBI high-to-low upon receipt of an active high hit signal HIT. The transition of the complementary hit signal HBI to an active low level will enable a plurality of NOR gates NR1-NR7 to be responsive to a plurality of soft priority signals, shown as P[0:6]. These soft priority signals P[0:6] are provided as inputs to a respective column within a stage of the hierarchical priority resolution circuit. The soft priority signals P[0:6] may have the numeric values illustrated below by TABLE 1.

As will be understood by those skilled in the art, the generation of an active low complementary hit signal HBI will cause the NOR gates NR1-NR7 to operate as inverters that drive a plurality of NMOS pull-down transistors N2-N8 with complementary soft priority signals PB0-PB6. As explained more fully hereinbelow with respect to FIG. 6, each of the complementary soft priority signal lines PB0-PB6 represents an input to a respective 8-input NOR gate having an output that is precharged high. The generation of an active low complementary hit signal HBI will also cause a second inverter I2 to turn on an NMOS pull-down transistor N1. When the NMOS pull-down transistor N1 is turned on, a complementary match line MATCHB will be discharged to a logic 0 level from a previously precharged logic 1 level. Pull-up and hold (or float) circuitry (not shown) for precharging the complementary match line MATCHB may be of conventional design. (See, e.g., FIG. 6, which illustrates circuitry for holding match lines ML0-ML7 at precharged levels).

Accordingly, if HBI=0, then based on the illustrated configuration of the NOR gates NR1-NR7, the receipt of any soft priority signals P[0:6] at logic 0 levels will cause previously precharged hierarchical control signal lines H[0:6] to be pulled high-to-low by respective NMOS pull-down transistors N2-N8. The hierarchical control signal lines, also referred to herein as "H" signal lines H[0:6], may have the values illustrated below by TABLE 2. Thus, when HBI=0, the receipt of a soft priority signal P[0:6] equal to 0, 1, 2, 3, 4, 5, 6 or 7 may cause the H signal lines H[0:6] to achieve a matching value equal to 0, 1, 2, 3, 4, 5, 6 or 7, respectively. Alternatively, if the contributions of other soft priority resolution circuits are considered in accordance with FIGS. 6A-1 and 6A-2, described hereinbelow, the receipt of a soft priority signal P[0:6] equal to 0, 1, 2, 3, 4, 5, 6 or 7 will cause the H signal lines H[0:6] to achieve an equal or higher value of 0, ≧1, ≧2, ≧3, ≧4, ≧5, ≈6 or ≧7, respectively, where the H values H[0:6] are ordered so that 0>1>2>3>4>5>6>7.

TABLE 1

| P [0:6] | P0 | P1 | P2 | P3 | P4 | P5 | P6 |
|---|---|---|---|---|---|---|---|
| 0 | 0 | 0 | 0 | 0 | 0 | 0 | 0 |
| 1 | 1 | 0 | 0 | 0 | 0 | 0 | 0 |
| 2 | 1 | 1 | 0 | 0 | 0 | 0 | 0 |
| 3 | 1 | 1 | 1 | 0 | 0 | 0 | 0 |
| 4 | 1 | 1 | 1 | 1 | 0 | 0 | 0 |
| 5 | 1 | 1 | 1 | 1 | 1 | 0 | 0 |
| 6 | 1 | 1 | 1 | 1 | 1 | 1 | 0 |
| 7 | 1 | 1 | 1 | 1 | 1 | 1 | 1 |

TABLE 2

| H [0:6] | H0 | H1 | H2 | H3 | H4 | H5 | H6 |
|---|---|---|---|---|---|---|---|
| 0 | 0 | 0 | 0 | 0 | 0 | 0 | 0 |
| 1 | 1 | 0 | 0 | 0 | 0 | 0 | 0 |
| 2 | 1 | 1 | 0 | 0 | 0 | 0 | 0 |
| 3 | 1 | 1 | 1 | 0 | 0 | 0 | 0 |
| 4 | 1 | 1 | 1 | 1 | 0 | 0 | 0 |
| 5 | 1 | 1 | 1 | 1 | 1 | 0 | 0 |
| 6 | 1 | 1 | 1 | 1 | 1 | 1 | 0 |
| 7 | 1 | 1 | 1 | 1 | 1 | 1 | 1 |

The soft priority resolution circuit 40 of FIG. 3 also includes a plurality of NOR gates NR8-NR14. These NOR gates NR8-NR14 are provided for driving a plurality of OR signal lines, shown as OR[0:6]. A plurality of inverters I3-I9 are also provided to drive first inputs of the NOR gates NR8-NR14 with signals that equal /P[0:6], where the reference character "/" designates an inversion operation. Based on the illustrated configuration of the NOR gates NR8-NR14 and inverters I3-I9, each of the OR signal lines OR[0:6] will be held low whenever the corresponding one of the H signal lines H[0:6] is held high at its precharged level or the corresponding one of the soft priority signals P[0:6] is set low. Thus, signal line ORn will be held low whenever Pn=0 and/or Hn=1, where "n" is an integer. The H signal lines H[0:6] will also be treated herein as electrically coupled to outputs of the soft priority resolution circuit 40. These outputs are represented by the drain terminals of NMOS pull-down transistors N2-N8. The H signal lines H[0:6] are also electrically coupled to inputs of the soft priority resolution circuit 40. These inputs are represented as inputs to NOR gates NR8-NR14. Accordingly, the H signal lines H[0:6] operate both as inputs and outputs of a soft priority resolution circuit 40.

Referring still to FIG. 3, the OR signal lines OR[0:6] are provided to gate terminals of a plurality of NMOS pull-down transistors N9-N15, which are electrically connected in parallel between a "match" line ML and a pseudo-ground line PG. The match line ML is precharged high by operation of PMOS pull-up transistor P2, which has a gate terminal electrically connected to a complementary pseudo-ground line PGB. Upon becoming precharged at a high level, the match line ML is held (i.e., biased) high by operation of the PMOS pull-up transistor P1 and inverter I12. The PMOS pull-up transistor P1 is a narrow transistor that provides a weak pull-up and holding force on the match line ML. Under appropriate conditions, this weak pull-up force may be readily overcome by a stronger pull-down force provided by at least one wider and more highly conductive NMOS pull-down transistor (e.g., N9-N15). In other embodiments, the match line ML may be precharged high and then floated at a high level. However, a match line ML that is floated at a high level may be susceptible to switching noise if the parasitic capacitance between the match line ML and one or more adjacent (e.g., crossing) signal lines is substantial enough to pull the match line ML low through capacitive coupling.

The complementary pseudo-ground line PGB is controlled by the output of NAND gate ND2 and the pseudo-ground line PG is controlled by the output of inverter I10. The inverter I10 has an input that is responsive to the complementary pseudo-ground signal PGB. The complementary pseudo-ground signal PGB is also provided as a first input to NAND gate ND3. An inverter I11, which is responsive to a second enable signal E2, drives a second input of the NAND gate ND3. Based on the illustrated configuration of the NAND gates ND2-ND3 and the inverter I11, the complementary pseudo-ground signal PGB and the pseudo-ground signal PG will switch in accordance with the following truth table (TABLE 3). The designation "X" in TABLE 3 represents a "don't care" condition whereby the signal may be at a logic 0 level or a logic 1 level.

TABLE 3

| STATE | HBI | E2 | PGB | PG |
|---|---|---|---|---|
| LOAD HIT | 0 | X | 1 | 0 |
| IGNORE MISS | 1 | 1 | 0 | 1 |
| RESOLVE | 1 | 1→0 | 0 | 1 |
| INVALID | 1 | 0 | 1 | 0 |

The soft priority resolution circuit 40 of FIG. 3 generates an active low output hit signal, shown as HBO ("hit bar out"), whenever the following signal conditions are simultaneously met: E2=PG=0 and ML=1. The output hit signal HBO is generated by a NAND gate ND4 that receives a strobe signal STR at one input and a match line signal ML at a second input. The NAND gate ND4 generates HBO=/ML (or MLB, where the suffix "B" designates the complementary state of the signal to which it pertains), whenever the strobe signal line STR is driven low-to-high by the NOR gate NR15.

Operation of the soft priority resolution circuit 40 of FIG. 3 will now be described more fully with reference to TABLE 4, which shows the logic states of various signals illustrated by FIG. 3 during four designated modes of operation. These modes of operation include an "inactive" mode, an "ignore miss" mode, a "load hit" mode and a "resolve hit" mode. The "ignore miss" mode may also be treated as a "block miss" mode.

signal E1B. When the first NAND gate ND1 is disposed in the blocking mode, the value of the complementary hit signal HBI will be set to a logic 1 level and the outputs of the NOR gates NR1-NR7 will be held low. During the inactive mode, the complementary match line MATCHB will remain precharged at a high level along with the hierarchical control signal lines H[0:6]. The complementary match line MATCHB and H signal lines H[0:6] may be precharged and held at a high level (e.g., Vdd) by conventional circuitry (not shown). The second enable signal E2 will also be set to a logic 1 level and this level will cause the output of inverter I11 to be held low at a logic 0 level and the output of NAND gate ND3 to be held high at a logic 1 level. Under these conditions, both inputs of the NAND gate ND2 will be set high, the complementary pseudo-ground line at the output of the NAND gate ND2 will be set low, the pseudo-ground line PG will be set high by inverter I10 and the match line ML will be precharged and held high by PMOS pull-up transistors P1 and P2. Holding the second enable signal line E2 at a logic 1 level during the inactive mode will also cause the NOR gate NR15 to hold the strobe signal line STR low. When the strobe signal line STR is held low, the output hit signal line HBO will be held inactive at a high level. Thus, during the inactive mode, the soft priority resolution circuit 40 will operate to block any active or inactive hit signal HIT from influencing the value of the output hit signal line HBO. The complementary match line MATCHB, the pseudo-ground line PG, the match line ML and the hierarchical control signal lines H[0:6] will also remain high at precharged levels during the inactive mode.

The second row of TABLE 4 shows the states of various signals within the soft priority resolution circuit 40 when an inactive hit signal HIT=0 is received and the first enable signal E1 is active (i.e., E1=0). In particular, the receipt of an inactive hit signal will cause the complementary hit signal line HBI to be held high at its previously high level (during the inactive mode). Under these conditions, none of the NMOS pull-down transistors N1-N8 will be operative to actively pull-down the complementary match line MATCHB or any of the hierarchical control signal lines H[0:6] from their precharged levels. However, one or more of the hierarchical control signal lines H[0:6] and the complementary match line MATCHB may be pulled high-to-low by one or more other columns of soft priority resolution circuits in the same stage or tier, as explained more fully hereinbelow with respect to FIG. 6.

The third row of TABLE 4 shows the states of various signals when an active hit signal HIT=1 is loaded into the soft priority resolution circuit 40. Under these conditions, the complementary hit signal line HBI is set low at a logic 0 level

TABLE 4

| STATE | E1 | E1B | HIT | HBI | E2 | PGB | PG | ML | STR | HBO | MATCHB |
|---|---|---|---|---|---|---|---|---|---|---|---|
| Inactive | 1 | 0 | X | 1 | 1 | 0 | 1 | 1 | 0 | 1 | 1 |
| Ignore Miss | 0 | 1 | 0 | 1 | 1 | 0 | 1 | 1 | 0 | 1 | 1/0 |
| Load Hit | 0 | 1 | 1 | 0 | 1 | 1 | 0 | 1/0 | 0 | 1 | 0 |
| Resolve Hit | 0 | 1 | 1 | 0 | 0 | 1 | 0 | 1/0 | 1 | 0/1 | 0 |

As illustrated by TABLE 4, the inactive mode is achieved by setting both the first and second enable signals high at logic 1 levels (i.e., E1=E2=1). When the first enable signal E1 is set to a logic 1 level, the soft priority resolution circuit 40 will not be responsive to any active high hit signal HIT because the NAND gate ND1 will be disposed in a blocking mode that is controlled by the value of the complementary first enable and the NOR gates NR1-NR7 are enabled to respond to the soft priority signals P[0:6]. The complementary pseudo-ground line PGB will also be switched high by NAND gate ND2 and the pseudo-ground line PG will be pulled low by inverter I10. The signal line HBIB at the output of the inverter I2 will also be switched high and the complementary match line MATCHB will be pulled low by NMOS pull-down transistor N1 (and possibly other corresponding pull-down transistors in adjacent soft priority resolution circuits). In the event the soft priority signals P[0:6] are all represented by logic 0 levels (i.e., P[0:6]=0), then all H signal lines H[0:6] will be pulled low and all OR signal lines [0:6] will be held low by NOR gates NR8-NR14. Under these conditions, none of the NMOS pull-down transistors N9-N15 will be operative to discharge the match line ML from its precharged high level. The logic high level on the match line ML will nonetheless be blocked from influencing the output hit signal line HBO because the strobe signal line STR at the output of the NOR gate NR15 will be held low. The strobe signal line STR is held low because the second enable signal E2 is held at an inactive logic 1 level during an operation to load an active hit signal HIT.

If, on the other hand, the corresponding soft priority signals P[0:6] are not all represented by logic 0 levels when a hit is loaded, then the states of the H signal lines H[0:6] will need to be known in order to determine whether the match line ML is to be pulled high-to-low during an operation to load a hit. This is best illustrated by TABLE 5, which further identifies the states of the match line ML and the output hit signal line HBO when an active hit signal is initially loaded into the soft priority resolution circuit 40 and then resolved by switching the second enable signal E2 high-to-low (so that the strobe signal STR switches low-to-high and enables the output of NAND gate ND4).

The condition that H[0:6]=0 means that another active hit signal HIT having a higher soft priority is present in another column in the same stage.

Referring again to the soft priority resolution circuit 40 of FIG. 3, the signal conditions reflected by Case 2 mean that during loading of the active hit signal HIT, P0 will be at a logic 1 level, P1-P6 will be at logic 0 levels and all the hierarchical control signal lines H0-H6 will also be at logic 0 levels. Accordingly, both inputs to NOR gate NR8 will be set to logic 0 levels and the signal line OR0 will be set to a logic 1 level to thereby turn on NMOS pull-down transistor N9. In response to the turn on of the NMOS pull-down transistor N9, the match line ML will become discharged (NMOS pull-down transistor N9 will overcome the weak pull-up provided by PMOS pull-up transistor P1). The discharge of the match line ML to a logic 0 level will operate to hold the output hit signal line HBO at the output of NAND gate ND4 at a logic 1 level, to thereby reflect a loss vis-a-vis another active hit signal HIT associated with another soft priority resolution circuit 40 within the same stage or tier of soft priority resolution circuits.

In Case 3, the equivalency between the soft priority value P[0:6]=1 and the value of the hierarchical controls signal lines H[0:6]=1 represents a win or tie condition. If a tie is present, then all active hit signals HIT associated with the tie will be passed to the next tier of soft (or hard) priority resolution circuits. In Case 4, the soft priority value P[0:6] equals 2 and

TABLE 5

| | P[0:6] | H[0:6] | STATUS | HIT | E1 | E2 | HBI | ML | HBO |
|---|---|---|---|---|---|---|---|---|---|
| Case 1 | 0 | 0 | WIN/TIE | 1 | 0 | 0 | 0 | 1 | 0 |
| Case 2 | 1 | 0 | LOSE | 1 | 0 | 0 | 0 | 0 | 1 |
| Case 3 | 1 | 1 | WIN/TIE | 1 | 0 | 0 | 0 | 1 | 0 |
| Case 4 | 2 | <2 | LOSE | 1 | 0 | 0 | 0 | 0 | 1 |
| Case 5 | 2 | =2 | WIN/TIE | 1 | 0 | 0 | 0 | 1 | 0 |
| Case 6 | 3 | <3 | LOSE | 1 | 0 | 0 | 0 | 0 | 1 |
| Case 7 | 3 | =3 | WIN/TIE | 1 | 0 | 0 | 0 | 1 | 0 |
| Case 8 | 4 | <4 | LOSE | 1 | 0 | 0 | 0 | 0 | 1 |
| Case 9 | 4 | =4 | WIN/TIE | 1 | 0 | 0 | 0 | 1 | 0 |
| Case 10 | 5 | <5 | LOSE | 1 | 0 | 0 | 0 | 0 | 1 |
| Case 11 | 5 | =5 | WIN/TIE | 1 | 0 | 0 | 0 | 1 | 0 |
| Case 12 | 6 | <6 | LOSE | 1 | 0 | 0 | 0 | 0 | 1 |
| Case 13 | 6 | =6 | WIN/TIE | 1 | 0 | 0 | 0 | 1 | 0 |
| Case 14 | 7 | <7 | LOSE | 1 | 0 | 0 | 0 | 0 | 1 |
| Case 15 | 7 | =7 | WIN/TIE | 1 | 0 | 0 | 0 | 1 | 0 |

As illustrated by TABLE 5, when an active hit signal HIT=1 is resolved by a respective soft priority resolution circuit 40, one of fifteen (15) possible conditions may be present that influence whether the active hit signal HIT wins, ties or loses relative to another active hit signal HIT associated with another CAM array block. Under the conditions set forth by Case 1 in TABLE 5, if the soft priority signals received by a particular soft priority resolution circuit 40 represent the highest soft priority associated with a corresponding most significant bit class, intermediate significant bit class or least significant bit class, for example, then a win or tie is the only possible resolution because all other active hit signals HIT must be of equal or lower soft priority. Accordingly, in Case 1, the output hit signal line HBO will be set low whenever an active hit signal HIT having a soft priority equal to P[0:6]=0 is resolved. In Case 2, the active hit signal HIT will lose out to another hit signal HIT having a higher soft priority because P[0:6]=1 is less than H[0:6]=0.

the hierarchical controls signal lines H[0:6] equal 0 or 1. In this case, the active hit signal HIT loses to one or more other active hit signals HIT having a soft priority equal to 0 or 1. The other illustrated cases are resolved in a similar manner.

Figure 4:
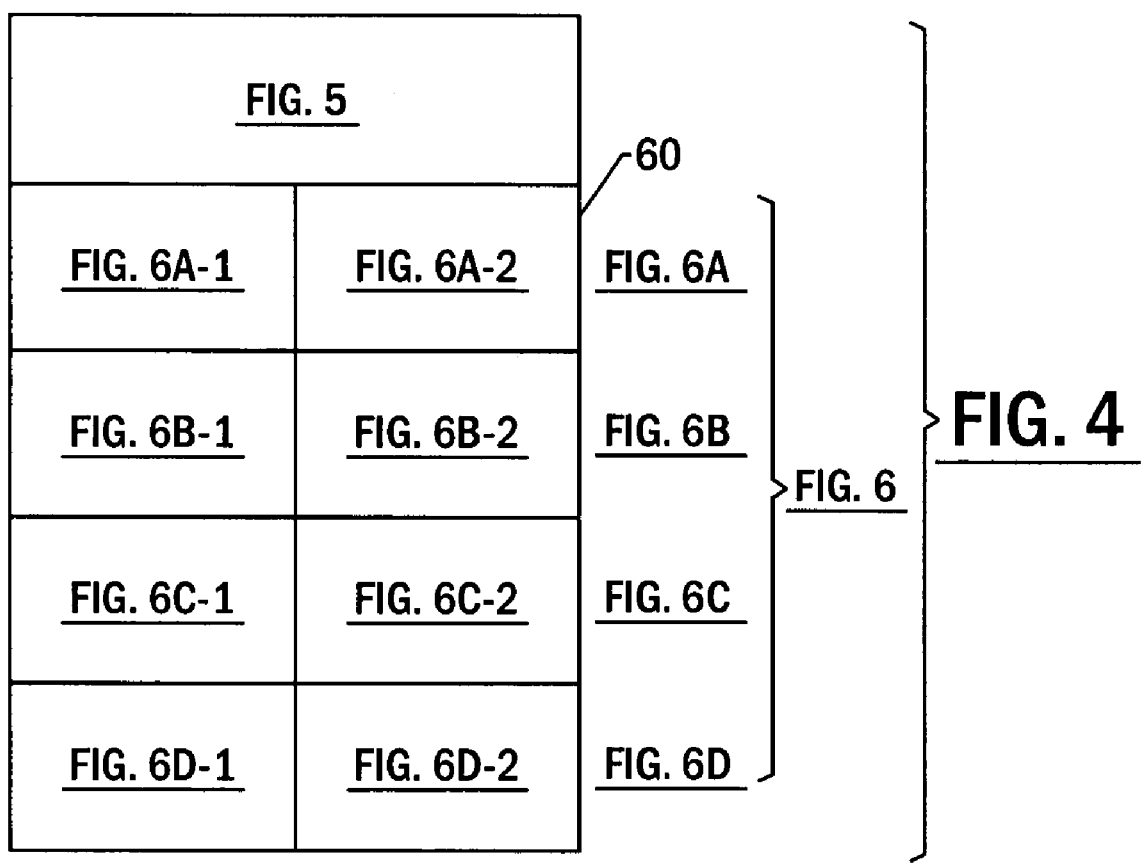
FIG. 4 is a block diagram that illustrates the relative placement of the components of FIGS. 5 and 6 relative to each other according to embodiments of the present invention.
Figure 5:
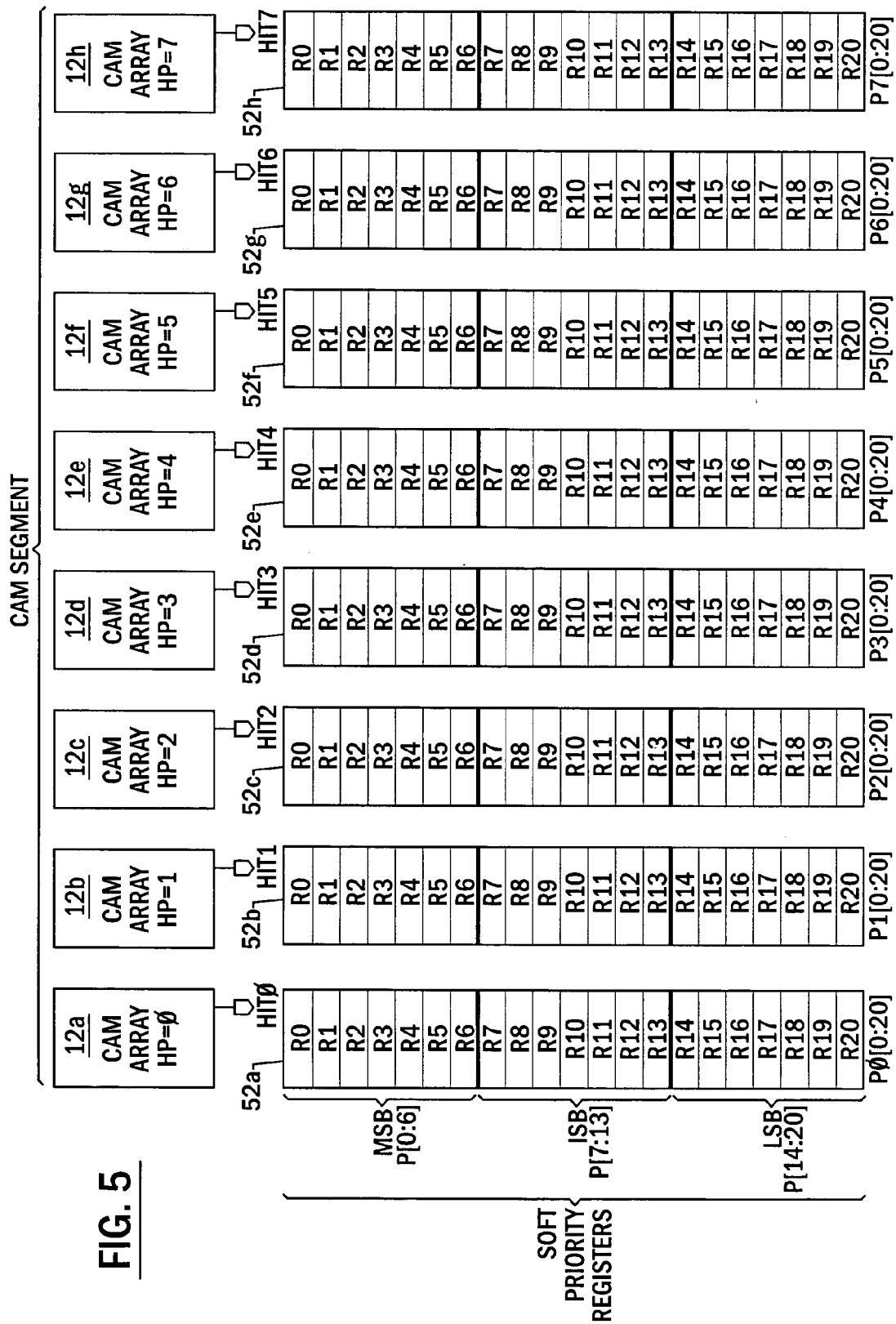
FIG. 5 is a block diagram of a segment of CAM array blocks having positional-based hard priorities and programmable soft priorities assigned thereto according to embodiments of the present invention.

The operations and circuit components described above with respect to FIGS. 1-3 will now be more fully described with reference to FIGS. 4-6. In FIG. 5, a block diagram that illustrates an entire segment of CAM array blocks having positional-based hard priorities and programmable soft priorities assigned thereto is provided. In FIG. 6, an electrical schematic of a 4-stage hierarchical priority resolution circuit that services the segment of CAM array blocks illustrated by FIG. 5 is provided. This 4-stage circuit includes three soft priority resolution stages and one hard priority resolution stage. In FIG. 4, a block diagram that illustrates the relative placement of the electrical components of FIGS. 5 and 6 is provided for ease of understanding. In the event the CAM device 10 includes 256 CAM array blocks having soft priorities in a range between $00001_4$ to $33331_4$ (i.e., 0 to 255), then the hierarchical priority resolution circuit may include four soft priority resolution stages (preferably with 3H signal lines H[0:2] per stage) and one hard priority resolution stage. Alternatively, in the event the CAM device 10 includes 64 CAM array blocks having soft priorities in a range between 00|₈ to 77|₈ (i.e., 0 to 63), then the hierarchical priority resolution circuit may include two soft priority resolution stages (preferably with 7 H signal lines H[0:6] per stage) and one hard priority resolution stage.

In particular, FIG. 5 illustrates a segment 50 of CAM array blocks 12a-12h that are arranged in a left-to-right sequence according to their hard priority. As illustrated, each CAM array block 12a-12h (or circuitry associated with a block) generates a respective hit signal. The hit signals, shown as HIT0-HIT7, may be active high signals that reflect the presence of at least one matching entry within a respective CAM array block that is detected in response to a search operation. Techniques for generating active hit signals HIT and resolving competing row priorities between multiple matching entries within a CAM array block are more fully described in U.S. Provisional Application Ser. No. 60/364,696, filed Mar. 15, 2002, entitled "Content Addressable Memory (CAM) Devices that Utilize Priority Class Detectors to Identify Highest Priority Matches in Multiple CAM Arrays and Methods of Operating Same," the disclosure of which is hereby incorporated herein by reference. As described by the '696 application, row priority encoders may be provided to resolve competing row priorities between multiple matching entries within a CAM array block or blocks. FIG. 5 also illustrates a plurality of soft priority registers 52a-52h that retain soft priority data for each of the CAM array blocks 12a-12h. Conventional programming circuitry) (not shown) may be used for writing respective soft priority values into each of the soft priority registers 52a-52h. These soft priority values need not be unique to each priority register because multiple CAM array blocks can be assigned the same soft priority upon start-up or thereafter, as described above with respect to FIG. 2.

These soft priority registers 52a-52h are illustrated as comprising 21 latches (e.g., D-type flip-flops), which are arranged into three groups of seven latches (shown as R0-R20). The three groups include a most significant bit (MSB) group, an intermediate significant bit (ISB) group and a least significant bit (LSB) group. Each MSB group of latches (R0-R6) generates seven soft priority signals (shown as P0[0:6], . . . , P7[0:6]) that are provided to a first stage or tier of the hierarchical priority resolution circuit 60. Similarly, each ISB group of latches (R7-R13) generates seven soft priority signals (shown as P0[7:13], P7[7:13]) that are provided to a second stage of the hierarchical priority resolution circuit 60. Finally, each LSB group of latches (R14-R20) generates seven soft priority signals (shown as P0[14:20], P7[14:20]) that are provided to a third stage of the hierarchical priority resolution circuit 60. From a layout standpoint, these soft priority registers 52a-52h of FIG. 5 may be interspersed between columns of the hierarchical priority resolution circuit 60 illustrated by FIGS. 6A-6C, and may be treated herein as part of the hierarchical priority resolution circuit 60.

Referring now to FIG. 6A, a first stage 60a of a preferred hierarchical priority resolution circuit 60 includes eight (8) columns of soft priority resolution circuits. The leftmost column is designated by the reference numeral 40' to reflect its similarity to the soft priority resolution circuit 40 of FIG. 3. The first stage 60a of the hierarchical priority resolution circuit receives eight (8) hit signals, shown as HIT0-HIT7, and generates eight (8) output hit signals, shown as HBO_0a-HBO_7a. These hit signals may be derived from a segment of CAM array blocks. The first enable signal E1 and the second enable signal E2 described above with reference to FIG. 3 are reflected in FIG. 6A as signals AE and BE, respectively. These enable signals may be generated by a self-timed signal generator (not shown) that first switches signal AE high-to-low and then, after a predetermined amount of time necessary to load one or more of the hit signals, switches signal BE high-to-low so that any active hit signals may be resolved.

The first stage 60a may also operate to switch a complementary match line MATCHB high-to-low from a precharged high level, upon loading of at least one active hit signal (HIT0-HIT7). The logic state of the complementary match line MATCHB may be monitored to determine whether or not at least one match condition (of any priority) is present in any one of the CAM array blocks 12a-12h within a segment. Based on the MSB soft priority signals P0[0:6]-P7[0:6] and the receipt of at least one active hit signal, the first stage 60a may also operate to switch one or more hierarchical control signal lines low from respective precharged levels in order to resolve competing soft priorities between two or more active hit signals. These hierarchical control signal lines, which are shown as AH[0:6] in FIG. 6A, are connected in a wired-OR manner to outputs from the eight columns of soft priority resolution circuits 40'. These outputs are best illustrated by the drain terminals of NMOS pull-down transistors N2-N8 in the soft priority resolution circuit 40 of FIG. 3. In particular, the NMOS pull-down transistors N2 in the eight columns of soft priority resolution circuits 40' represent an 8-input NOR gate having an output represented by a respective hierarchical control signal line (shown as AH[0]). As described herein, reference to "wired-OR" connections include wired-OR and wired-NOR connections. The complementary match line MATCHB and the hierarchical control signal lines AH[0:6] may be precharged high by a signal generation and capture circuit (not shown) that may be positioned to the right of the circuit elements illustrated by FIGS. 6A-2. This signal capture circuit may also be used to latch the logic states of the complementary match line MATCHB and the hierarchical control signal lines AH[0:6] after the hit signals associated with the first stage 60a are resolved.

The resolution of the MSB portion of the soft priority of one or more active hit signals HIT0-HIT7 by the first stage 60a will manifest itself as one or more active low output hit signals HBO_0a-HBO_7a from the first stage 60a. As illustrated by the second stage 60b of the hierarchical priority resolution circuit 60, which represents the ISB portion of the hierarchical priority resolution circuit 60, the output hit signals HBO_0a-HBO_7a from the first stage 60a are transferred directly as inputs to the second stage 60b and thereby loaded if active at logic 0 levels. The second stage 60b need not include eight copies of the inverter I1 and the NAND gate ND1 illustrated by the soft priority resolution circuit 40 of FIG. 3. The second stage 60b is responsive to a third enable signal CE. This third enable signal CE performs the same function as the second enable signal E2 illustrated by FIG. 3 and may be generated by the self-timed signal generator (not shown). In particular, the third enable signal CE may transition high-to-low a predetermined amount time after the second enable signal BE switches high-to-low. The second stage 60b resolves competing soft priorities at the ISB level by evaluating the ISB soft priority signals P0[7:13]-P7[7:13] and possibly generating one or more active low output hit signals HBO_0b-HBO_7b and one or more active low hierarchical control signals BH[0:6], in response to the output hit signals HBO_0a-HBO_7a received from the first stage 60a. The logic states of the hierarchical control signal lines BH[0:6] may be captured by the signal generation and capture circuit (not shown).

The resolution of the ISB portion of the soft priority of one or more active hit signals HIT0-HIT7 by the second stage 60b will manifest itself as one or more active low output hit signals HBO_0b-HBO_7b from the second stage 60b. As illustrated by the third stage 60c of the hierarchical priority resolution circuit 60, which represents the LSB portion of the hierarchical priority resolution circuit 60, the output hit signals HBO_0b-HBO_7b from the second stage 60b are transferred directly as inputs to the third stage 60c. The third stage 60c is responsive to a fourth enable signal DE. This fourth enable signal DE performs the same function as the second enable signal E2 illustrated by FIG. 3 and may be generated by the self-timed signal generator (not shown). In particular, the fourth enable signal DE may transition high-to-low a predetermined amount time after the third enable signal CE switches high-to-low. The third stage 60c resolves competing soft priorities at the LSB level by evaluating the LSB soft priority signals P0[14:20]-P7[14:20] and possibly generating one or more active low output hit signals HBO_0c-HBO_7c and one or more active low hierarchical control signals CH[0:6], in response to the output hit signals HBO_0b-HBO_7b received from the second stage 60b. The logic states of the hierarchical control signal lines CH[0:6] may be captured by the signal generation and capture circuit (not shown).

Figures 1, 6D:
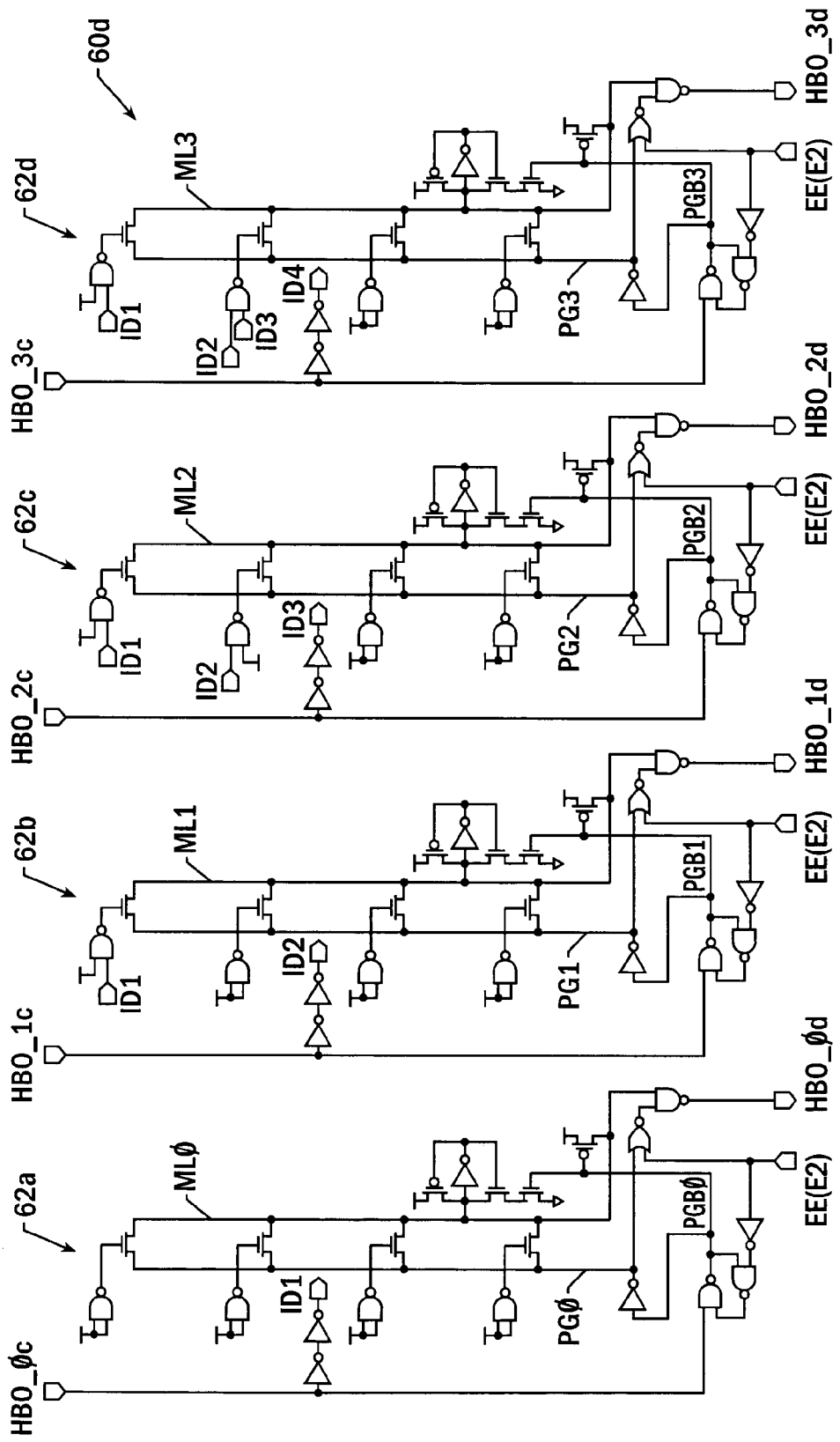
FIG. 6D is an electrical schematic that illustrates a fourth hard priority resolution stage of the hierarchical priority resolution circuit of FIG. 6 according to embodiments of the present invention.
Figures 2, 6D:
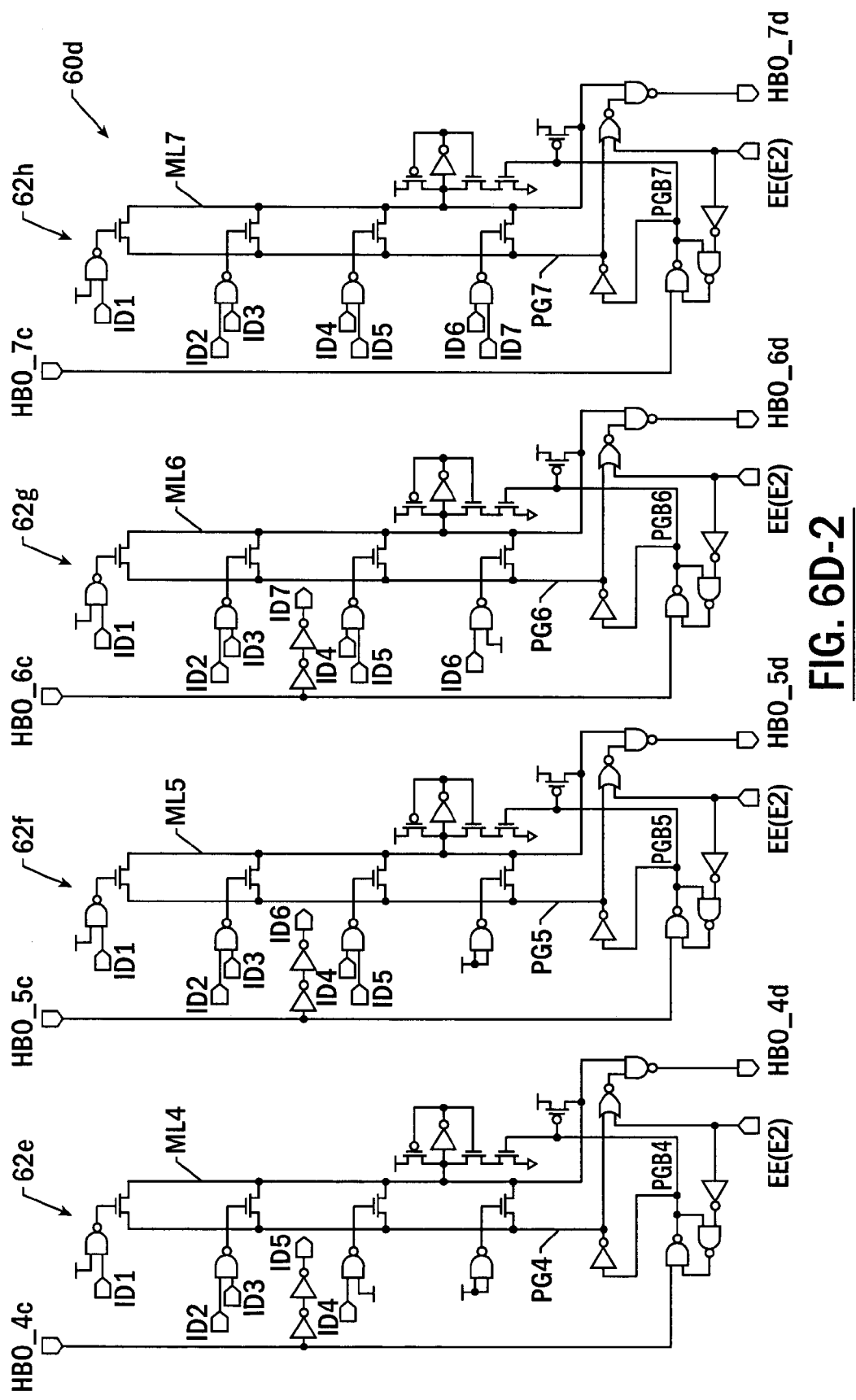

The output hit signals HBO_0c-HBO_7c from the third stage 60c may be encoded directly to identify which of the CAM array blocks 12a-12h containing at least one matching entry therein is of highest soft priority. This scenario may apply in applications where each CAM array block is required to have a unique soft priority. However, in other embodiments, the output hit signals HBO_0c-HBO_7c are provided directly to a fourth stage 60d that resolves competing hard priorities between hit signals associated with multiple CAM array blocks having the same soft priority. This fourth stage 60d, which is responsive to a fifth enable signal EE, is illustrated by FIG. 6D. The fifth enable signal EE may be generated by a self-timed signal generator (not shown) and may transition high-to-low a predetermined amount time after the fourth enable signal DE switches high-to-low. The outputs of the fourth stage 60d are illustrated as HBO_0d-HBO_7d.

The entries in TABLE 6 illustrate the nine possible ways in which the output hit signals HBO_0c-HBO_7c received at the inputs of the fourth stage 60d may be resolved when multiple hit signals having the same highest soft priority are present. The designation "X" in TABLE 6 represents a "don't care" condition whereby the signal may be at a logic 0 level or a logic 1 level. In Case 1, an active hit signal HIT associated with the first CAM array block 12a wins out over all other active hit signals if the first CAM array has the highest soft priority. Thus, in Case 1, the outputs HBO_0d-HBO_7d of the fourth stage 60d will equal {0111111} whenever the inputs to the fourth stage 60d equal {0XXXXXX}. In Case 2, an active hit signal HIT associated with the second CAM array block 12b wins out over all other active hit signals if the second CAM array has the highest soft priority and no active hit signal of equivalent soft priority is present in the first CAM array block 12a. Thus, in Case 2, the outputs HBO_0d-HBO_7d of the fourth stage 60d will equal {10111111} whenever the inputs to the fourth stage 60d equal {10XXXXX}. In Case 3, an active hit signal HIT associated with the third CAM array block 12c wins out over all other active hit signals if the third CAM array has the highest soft priority and no active hit signal of equivalent soft priority is present in either the first CAM array block 12a or the second CAM array block 12b. Thus, in Case 3, the outputs HBO_0d-HBO_7d of the fourth stage 60d will equal {11011111} whenever the inputs to the fourth stage 60d equal {110XXXX}. Cases 4-8 operate in a similar manner. In the last case, Case 9, no active hit signals of any priority make it to the fourth stage 60d and, therefore, no active hit signals are present in any of the illustrated CAM array blocks 12a-12g upon completion of a search operation.

TABLE 6

| | HBO | | | | | | | | | | | | | | |
|---|---|---|---|---|---|---|---|---|---|---|---|---|---|---|---|
| | Input to Fourth Stage | | | | | | | | Output from Fourth Stage | | | | | | |
| | 0c | 1c | 2c | 3c | 4c | 5c | 6c | 7c | 0d | 1d | 2d | 3d | 4d | 5d | 6d | 7d |
| Case 1 | 0 | X | X | X | X | X | X | X | 0 | 1 | 1 | 1 | 1 | 1 | 1 | 1 |
| Case 2 | 1 | 0 | X | X | X | X | X | X | 1 | 0 | 1 | 1 | 1 | 1 | 1 | 1 |
| Case 3 | 1 | 1 | 0 | X | X | X | X | X | 1 | 1 | 0 | 1 | 1 | 1 | 1 | 1 |
| Case 4 | 1 | 1 | 1 | 0 | X | X | X | X | 1 | 1 | 1 | 0 | 1 | 1 | 1 | 1 |
| Case 5 | 1 | 1 | 1 | 1 | 0 | X | X | X | 1 | 1 | 1 | 1 | 0 | 1 | 1 | 1 |
| Case 6 | 1 | 1 | 1 | 1 | 1 | 0 | X | X | 1 | 1 | 1 | 1 | 1 | 0 | 1 | 1 |
| Case 7 | 1 | 1 | 1 | 1 | 1 | 1 | 0 | X | 1 | 1 | 1 | 1 | 1 | 1 | 0 | 1 |
| Case 8 | 1 | 1 | 1 | 1 | 1 | 1 | 1 | 0 | 1 | 1 | 1 | 1 | 1 | 1 | 1 | 0 |
| Case 9 | 1 | 1 | 1 | 1 | 1 | 1 | 1 | 1 | 1 | 1 | 1 | 1 | 1 | 1 | 1 | 1 |

The conditions illustrated by Case 1 in TABLE 6 reflect the condition whereby the inputs HBO_0c-HBO_7c to the fourth stage 60d equal {0XXXXXX}. In Case 1, the hit signal HIT0 illustrated by FIG. 5 represents a hit signal generated by a first CAM array block 12a having a highest soft priority relative to all other CAM array blocks within the same segment. Under these conditions, an active first ID signal (ID1=0) is generated by the first column 62a of the fourth stage 60d. As illustrated in FIGS. 6D-1, this first ID signal ID1 represents the output of a two-stage buffer (shown as two inverters) that receives signal HBO_0c at an input. When signal HBO_0c is switched high-to-low, the complementary pseudo-ground signal PGB0 is switched low-to-high and the pseudo-ground signal PG0 is switched high-to-low. The precharged match line ML0 associated with the first column 62a will not be discharged because the four NAND gates in the first column 62a have inputs that are hard-wired to a logic 1 level (shown as Vdd). Thus, the outputs of the four NAND gates in the first column 62a will all be held at logic 0 levels and the four NMOS pull-down transistors that are connected between the pseudo-ground line PG0 and the match line ML0 will remain off. Accordingly, if the signal HBO_0c received by the fourth stage 60d is active at a logic 0 level, then the transition of the fifth enable signal EE from high-to-low will enable the output NAND gate in the first column 62a to generate an active low output signal HBO_0d, which designates the first hit signal HIT0 as the hit signal having the highest soft priority through the third stage 60c and the highest hard priority through the fourth stage 60d.

As illustrated by the second-eighth columns 62b-62h, the active first ID signal (ID1=0) generated by the first column 62a is provided as an input to the uppermost NAND gates in the second-eighth columns 62b-62h. This active first ID signal ID1 causes the precharged match line ML1 to become discharged in the event the signal HBO_1c is active at a logic 0 level. In this manner, the active first ID signal ID1 blocks the signal HBO_1c into the second column 62b from being transferred as an active signal to the output HBO_1d of the second column 62b when the fifth enable signal EE switches high-to-low. Similarly, the active first ID signal ID1 causes the precharged match line ML2 to become discharged in the event the signal HBO_2c into the third column 62c is active at a logic 0 level. In this manner, the active first ID signal ID1 blocks the signal HBO_2c from being transferred as an active signal to the output HBO_2d of the second column 62c when the fifth enable signal EE switches high-to-low. The active first ID signal ID1 operates in a similar manner to block signals HBO_3c-HBO_7c. Likewise, an active second ID signal ID2 (ID2=0) operates to block signals HBO_2c-HBO_7c. Thus, if signal HBO_1c is passed to the fourth stage 60d as an active low signal, then signal HBO_1d will always be switched low when the fifth enable signal EE switches high-to-low, unless ID1=0. The third-seventh ID signals ID3-7 operate in a similar manner to block all input signals to the fourth stage 60d that are of lower hard priority.

Thus, as described above, content addressable memory (CAM) devices use both hard and soft priority techniques to allocate entries of different priority. The priorities of multiple CAM array blocks within the CAM device may be programmed before or as entries are loaded therein and may be reprogrammed during operation as the allocation of entries within the CAM device changes. The allocation of entries may change in response to additions or deletions of entries or as entries are reprioritized. The CAM devices include priority resolution circuits that can resolve competing soft and hard priorities between multiple hit signals that are generated in response to a search operation. Such hit signals may be active to reflect the presence of at least one matching entry within a CAM array block. The resolution of which active hit signal has the highest overall priority among many can be used to facilitate the identification of the location (e.g., array address and row address) of a highest priority matching entry within the entire CAM device. A priority resolution circuit may also resolve competing hard priorities between two or more active hit signals having equivalent soft priority. This aspect of the priority resolution circuit is provided so that an active hit signal having a highest overall priority can be resolved whenever multiple CAM array blocks having the same soft priority are detected as having matching entries therein during a search operation.

CAM devices according to still further embodiments of the present invention may provide alternative techniques for assigning soft priority values to hit signals and identifying an active hit signal having a highest soft priority from a plurality of active hit signals. For example, the CAM device 10" of FIG. 7, which is similar to the CAM system 30 illustrated by FIG. 3 of the aforementioned 797 application, includes a segment 12 of CAM array blocks 12a-12h and encoding logic 32 that is capable of generating an address of a highest priority matching entry within a highest priority CAM array block having at least one matching entry therein. This encoding logic 32 is illustrated as including an array priority encoder 20" that is capable of generating an address of a CAM array block associated with a highest priority active hit signal.

In particular, the plurality of CAM array blocks 12a-12h are illustrated as having respective hard priorities, shown in binary format as HP=000$I_2$ to HP=111$I_2$. In some applications, these hard priorities may be treated as routing values and/or physical addresses of the CAM array blocks 12a-12h. In response to application of a search word (e.g., CIDR address) during a search operation, the CAM array blocks 12a-12h generate respective hit signals, shown as HIT0-HIT7. As described above with respect to FIGS. 1-6, these hit signals HIT0-HIT7 may be active high hit signals that indicate the presence of at least one matching entry within a respective CAM array block. The CAM array blocks 12a-12h may also be capable of generating respective multi-bit index signals, shown as IDX0-IDX7. These index signals IDX0-IDX7, which may be generated by row priority encoder circuitry (not shown) associated with each CAM array block, may represent the addresses (e.g., row addresses) of the highest priority matching entries within the CAM array blocks. For example, in the event the hit signal HIT0 associated with the first CAM array block 12a is active at a high level, a first index signal IDX0 will provide an address (e.g., 12-bit row address) of a highest priority matching entry within the first CAM array block 12a.

Each of the hit signals HIT0-HIT7 is provided as an input to each of a plurality of multiplexers 72a-72h, which operate as a cross-point switch. The outputs of the multiplexers 72a-72h are connected to hit signal lines HITA-HITH. These hit signal lines HITA-HITH are provided as inputs to a hit signal priority encoder 74. The hit signal priority encoder 74, which may be of conventional design, is designed to weight the hit signals HITA-HITH, if active, according to the following priority relationship: HITA>HITB>HITC>HITD>HITE>HITF>HITG>HITH, and to generate a three-bit hit signal HIT[2:0] that designates the location of an active hit signal HITA-HITH having a highest soft priority. A programmable register 52' is also provided. The outputs of the programmable register 52' are provided as select signals to the plurality of multiplexers 72a-72h and also as data inputs to an output multiplexer 76. In some embodiments, the programmable register 52' is divided into a plurality of segments, shown as A-H, and each segment retains a programmable hard priority value. Thus, in the illustrated embodiment, the programmable register 52' may be a 24-bit register that is divided into eight (8) segments of 3-bits each. Upon start-up, the segments A-H may be programmed with values that designate the default values of the hard priorities of respective CAM array blocks 12a-12h. The relative soft priorities assigned to the hit signals HIT0-HIT7 may be varied by changing the locations of the hard priority values stored within the segments A-H of the programmable register 52'. In the illustrated embodiment, the hard priority value within segment A of the programmable register 52' operates to select one of the hit signals HIT0-HIT7 as a hit signal having a highest relative soft priority and the hard priority value within segment H of the programmable register 52' operates to select one of the hit signals HIT0-HIT7 as a hit signal having a lowest relative soft priority among the illustrated segment of hit signals HIT0-HIT7. Accordingly, upon start-up, if segments A-H of the programmable register 52' are programmed with the following default values: {A,B,C,D,E,F,G,H=000,001,010,011,100,101,110,111}, then the cross-point switch provided by multiplexers 72a-72h will route hit signals HIT0-HIT7 to hit signal lines HITA-HITH as follows:
HIT0→HITA
HIT1→HITB

HIT2→HITC
HIT3→HITD
HIT4→HITE
HIT5→HITF
HIT6→HITG
HIT7→HITH

Based on this default configuration of the programmable register 52', the soft priorities of the hit signals HIT0-HIT7 generated by the CAM array blocks 12a-12h will be weighted according to the following soft priority relationship: HIT0>HIT1>HIT2>HIT3>HIT4>HIT5>HIT6>HIT7.

Alternatively, if segments A-H of the programmable register 52' are programmed with the following values: {A,B,C,D,E,F,G,H=111,110,010,011,100,101,000,001}, then the cross-point switch provided by multiplexers 72a-72h will route hit signals HIT0-HIT7 to hit signal lines HITA-HITH as follows:

HIT7→HITA
HIT6→HITB
HIT2→HITC
HIT3→HITD
HIT4→HITE
HIT5→HITF
HIT0→HITG
HIT1→HITH

Based on this configuration of the programmable register 52', the soft priorities of the hit signals HIT0-HIT7 generated by the CAM array blocks 12a-12h will be weighted according to the following soft priority relationship: HIT7>HIT6>HIT2>HIT3>HIT4>HIT5>HIT0>HIT1.

As a final example, if segments A-H of the programmable register 52' are programmed with the following values: {A,B,C,D,E,F,G,H=111,000,010, 100,011,101,110,001}, then the cross-point switch provided by multiplexers 72a-72h will route hit signals HIT0-HIT7 to hit signal lines HITA-HITH as follows:

HIT7→HITA
HIT0→HITB
HIT2→HITC
HIT4→HITD
HIT3→HITE
HIT5→HITF
HIT6→HITG
HIT1→HITH

Based on this configuration of the programmable register 52', the soft priorities of the hit signals HIT0-HIT7 generated by the CAM array blocks 12a-12h will be weighted according to the following soft priority relationship: HIT7>HIT0>HIT2>HIT4>HIT3>HIT5>HIT6>HIT1. These and other aspects of the embodiment of FIG. 7 in a CIDR address routing application are more fully illustrated and described in the aforementioned 797 application.

The hit signal priority encoder 74 is configured to generate an output hit signal HIT[2:0] that identifies which of the hit signals HITA-HITH, if active, has the highest soft priority. In the illustrated embodiment, if hit signal HITA is active, then HIT[2:0]=000. Alternatively, if hit signal HITB is active and hit signal HITA is not active, then HIT[2:0]=001. The following relationship illustrates the value of the output hit signal HIT[2:0] when the designated hit signal is active and no hit signals having a higher soft priority are active:

HITA=1→HIT[2:0]=000
HITB=1 (HITA=0)→HIT[2:0]=001
HITC=1 (HITA-HITB=0)→HIT[2:0]=010
HITD=1 (HITA-HITC=0)→HIT[2:0]=011
HITE=1 (HITA-HITD=0)→HIT[2:0]=100
HITF=1 (HITA-HITE=0)→HIT[2:0]=101
HITG=1 (HITA-HITF=0)→HIT[2:0]=110
HITH=1 (HITA-HITG=0)→HIT[2:0]=111

Figure 7:
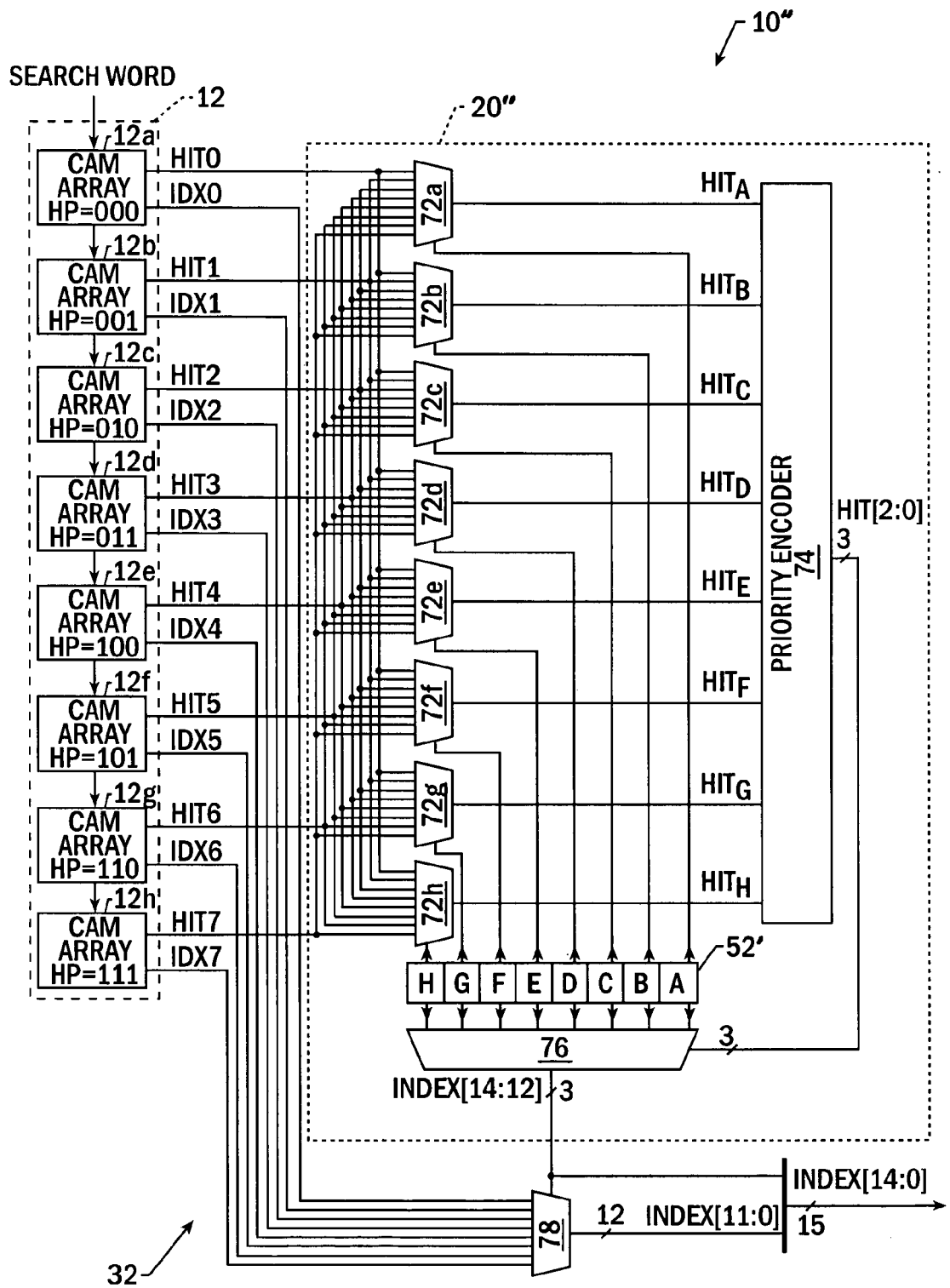
FIG. 7 is an electrical schematic of a CAM device according to another embodiment of the present invention.

The output hit signal HIT[2:0] generated by the hit signal priority encoder 74 is provided to the select input of the output multiplexer 76. In response to the output hit signal HIT[0:2], the output multiplexer 76 passes the hard priority value stored within a corresponding segment A-H of the programmable register 52'. This stored hard priority value may be treated as the most significant bits of an index signal INDEX, shown as INDEX[14:12], in accordance with the following relationship:

if HIT[0:2]=000, then INDEX[14:12]=A
if HIT[0:2]=001, then INDEX[14:12]=B
if HIT[0:2]=010, then INDEX[14:12]=C
if HIT[0:2]=011, then INDEX[14:12]=D
if HIT[0:2]=100, then INDEX[14:12]=E
if HIT[0:2]=101, then INDEX[14:12]=F
if HIT[0:2]=110, then INDEX[14:12]=G
if HIT[0:2]=111, then INDEX[14:12]=H As illustrated by FIG. 7, the most significant bits of the index signal, i.e., INDEX[14:12], are provided directly to an output of the encoding logic 32. These most significant bits identify the block address of the CAM array block responsible for generating an active hit signal having a highest soft priority signal. The most significant bits of the index signal are also provided to the select input of a final stage multiplexer 78, so that a desired one of the index signals IDX0-IDX7 is passed to the output of the encoding logic 32. The selected index signal is shown as INDEX[11:0]. Thus in response to a search operation, the encoding logic 32 generates a full address (block+row) of a highest priority matching entry within the illustrated segment of CAM array blocks 12a-12h. This full address is specified by the output index signal INDEX[14:0].

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A content addressable memory (CAM) device, comprising:
    a plurality of CAM array blocks each including a plurality of rows of CAM cells, wherein each CAM array block has a unique hard priority indicative of the CAM array block's physical location relative to the other CAM array blocks, and has an arbitrarily assigned soft priority that is independent of the CAM array block's physical location relative to the other CAM array blocks; and
    a priority resolution circuit configured to hierarchically resolve competing soft priorities between a plurality of active hit signals according to numeric significance so that a first of the plurality of active hit signals having a first soft priority will block resolution of a second of the plurality of active hit signals having a second soft priority when the first soft priority is higher than the second soft priority and vice versa when the second soft priority is higher than the first soft priority, and configured to resolve competing hard priorities between two or more of the plurality of active hit signals having equivalent highest soft priorities by identifying which of the two or more of the plurality of active hits signals has the highest hard priority.

2. The CAM device of claim 1, wherein said priority resolution circuit comprises a MSB soft priority resolution stage and a LSB soft priority resolution stage.

3. The CAM device of claim 2, wherein said priority resolution circuit comprises a hard priority resolution stage electrically coupled to outputs of said LSB soft priority resolution stage; and wherein said priority resolution circuit is further configured so that competing and unequal soft priorities of at least some of the plurality of active hit signals are completely resolved by the MSB and LSB soft priority resolution stages prior to further resolution of hard priority by the hard priority resolution stage.

4. The CAM device of claim 1,
wherein the priority resolution circuit comprises a plurality of registers that retain the soft priorities assigned to the plurality of CAM array blocks; and
wherein the priority resolution circuit is configured so that the soft priorities retained by the plurality of registers can be arranged in any order regardless of the values of hard priorities of the CAM array blocks.

5. The CAM device of claim 1, wherein the priority resolution circuit is configured to sequentially evaluate the soft priorities of the plurality of CAM array blocks in descending order according to numeric significance.

6. The CAM device of claim 1, wherein the priority resolution circuit comprises:
a first soft priority resolution circuit that is electrically coupled in a wired-OR manner to a first plurality of signal lines; and
a second soft priority resolution circuit that is electrically coupled in a wired-OR manner to a second plurality of signal lines.

7. The CAM device of claim 6, wherein the first and second plurality of signal lines are floated or biased at precharged levels during the search operation.

8. The CAM device of claim 6, wherein the priority resolution circuit further comprises:
a third soft priority resolution circuit that is electrically coupled in a wired-OR manner to a third plurality of signal lines.

9. The CAM device of claim 8, wherein the priority resolution circuit further comprises:
a hard priority resolution circuit that is electrically coupled to outputs of the third soft priority resolution circuit.

10. The CAM device of claim 1, wherein the priority resolution circuit comprises:
a soft priority resolution circuit; and
a hard priority resolution circuit that is electrically coupled to outputs of the soft priority resolution circuit.

11. The CAM device of claim 1, wherein the priority resolution circuit comprises:
a soft priority resolution circuit that is electrically coupled in a wired-OR manner to a first plurality of signal lines that are floated or biased at precharged levels during a priority resolution operation; and
a hard priority resolution circuit that is electrically coupled to outputs of the soft priority resolution circuit.

12. The CAM device of claim 1, wherein each row of CAM cells is coupled to a corresponding match line, and the CAM device further comprises:
a priority encoder coupled to the priority resolution circuit and configured to determine, for the CAM array block identified as having the highest soft and hard priorities, which row of CAM cells therein having an asserted match line has the highest priority.

13. The CAM device of claim 1, wherein the soft priorities are compared with each other.

14. A content addressable memory (CAM) device, comprising:
a priority resolution circuit configured to resolve competing soft priorities between a plurality of active hit signals associated with a corresponding plurality of CAM array blocks, each having a plurality of rows of CAM cells, in order to identify two or more active hit signals having highest equivalent soft priorities and further configured to resolve competing hard priorities between the two or more active hit signals in order to identify one as having the highest hard priority; and
wherein the priority resolution circuit is configured to resolve the competing soft priorities for all possible combinations of soft priority order between the plurality of active hit signals, wherein each hard priority is a unique value indicative of the corresponding CAM array block's physical location relative to the other CAM array blocks, and each soft priority is an arbitrarily assigned value that is independent of the corresponding CAM array block's physical location.

15. The CAM device of claim 14, wherein the competing soft priorities of the plurality of active hit signals are resolved by evaluating the soft priorities in a MSB to LSB sequence.

16. The CAM device of claim 14, wherein said priority resolution circuit is a hierarchical priority resolution circuit having at least two soft priority resolution stages and a hard priority resolution stage.

17. A content addressable memory (CAM) device, comprising:
a plurality of CAM array blocks each including a plurality of rows of CAM cells, wherein each CAM array block has a unique hard priority indicative of the CAM array block's physical location relative to the other CAM array blocks, and has an arbitrarily assigned soft priority that is independent of the CAM array block's hard priority;
means for identifying a highest priority one of said plurality of CAM array blocks having respective matching entries therein during a search operation, by evaluating the soft priorities of said plurality of CAM array blocks according to numeric significance so that matching entries in a first of said plurality of CAM array blocks are treated as having higher priority than matching entries in a second of said plurality of CAM array blocks when the soft priority of the first of said plurality of CAM array blocks is higher than the soft priority of the second of said plurality of CAM array blocks and vice versa when the soft priority of the second of said plurality of CAM array blocks is higher than the soft priority of the first of said plurality of CAM array blocks; and
means for identifying which of the matching CAM array blocks having the same soft priority has the higher hard priority.

18. A content addressable memory (CAM) device, comprising:
a plurality of CAM array blocks each including a plurality of rows of CAM cells; and
a hierarchical priority resolution circuit configured to identify a highest priority one of the plurality of CAM array blocks having respective matching entries therein during a search operation by:
evaluating soft priorities of the plurality of CAM array blocks according to numeric significance so that matching entries in a first of said plurality of CAM array blocks are treated as having higher priority than matching entries in a second of said plurality of CAM array blocks when the soft priority of the first of said plurality of CAM array blocks is higher than the soft priority of the second of said plurality of CAM array blocks and vice versa when the soft priority of the second of said plurality of CAM array blocks is higher than the soft priority of the first of said plurality of CAM array blocks; and then after completion of said evaluating soft priorities, evaluating competing hard priorities between at least two of the plurality of CAM array blocks having the same soft priorities, wherein each hard priority is a unique value indicative of the corresponding CAM array block's physical location relative to the other CAM array blocks, and each soft priority is an arbitrarily assigned value that is independent of the corresponding CAM array block's physical location.

19. A content addressable memory (CAM) device, comprising:

a plurality of CAM array blocks that each include a plurality of rows of CAM cells and that each have respective soft and hard priorities assigned thereto; and a priority resolution circuit configured to resolve competing soft priorities for all possible combinations of soft priority order between said plurality of CAM array blocks and further configured to resolve competing hard priorities between at least two of said plurality of CAM array blocks having the same soft priority, during an operation to search the plurality of CAM array blocks to identify respective matching entries therein, wherein each hard priority is a unique value indicative of the corresponding CAM array block's physical location relative to the other CAM array blocks, and each soft priority is an arbitrarily assigned value that is independent of the corresponding CAM array block's physical location.

20. The CAM device of claim 19, wherein the CAM device comprises $2^{N+1}$ CAM array blocks therein, where N is an integer; and wherein said priority resolution circuit comprises $\log_2 N$ groups of precharged signal lines that are used during a priority resolution operation to resolve competing soft priorities between hit signals generated by said plurality of CAM array blocks.

21. The CAM device of claim 19, wherein the CAM device comprises $2^{N+1}$ CAM array blocks, where N is an integer; and wherein said priority resolution circuit comprises $\log_2 N$ groups of N or N−1 precharged signal lines.

22. The CAM device of claim 19, wherein the CAM device comprises $(2^x)^y$ CAM array blocks, where x and y are integers; and wherein said priority resolution circuit comprises y groups of precharged signal lines having $2^x$ or $2^x-1$ signal lines per group.

23. The CAM device of claim 22, wherein x and y represent a pair of integers selected from the pair groups (x,y) consisting of (3,3), (2,4) and (3,2).

* * * * *